(12) United States Patent
Tanaka et al.

(10) Patent No.: US 7,679,159 B2
(45) Date of Patent: Mar. 16, 2010

(54) SOLID STATE IMAGING DEVICE AND SOLID STATE IMAGING ELEMENT

(75) Inventors: Hiromichi Tanaka, Daito (JP); Hideto Yoshimura, Daito (JP); Sumio Terakawa, Ibaraki (JP); Masafumi Kimata, Shiga-ken (JP)

(73) Assignee: Funal Electric Co., Ltd., Daito-shi (JP)

( * ) Notice: Subject to any disclaimer, the term of this patent is extended or adjusted under 35 U.S.C. 154(b) by 808 days.

(21) Appl. No.: 11/444,312

(22) Filed: Jun. 1, 2006

(65) Prior Publication Data

US 2006/0273361 A1 Dec. 7, 2006

(30) Foreign Application Priority Data

Jun. 1, 2005 (JP) .............................. 2005-161058

(51) Int. Cl.
*H01L 31/00* (2006.01)

(52) U.S. Cl. .................. 257/440; 257/291; 257/292; 257/461; 257/462; 257/464; 257/E31.053; 257/E31.054; 257/E31.082

(58) Field of Classification Search ......... 257/290–294, 257/461–464, E31.053, E31.054, E31.082, 257/E31.121, 89, 440

See application file for complete search history.

(56) References Cited

U.S. PATENT DOCUMENTS

| 6,852,562 | B1 * | 2/2005 | Hopper et al. | 438/57 |
| 2002/0063302 | A1 * | 5/2002 | Furumiya et al. | 257/432 |
| 2004/0094783 | A1 * | 5/2004 | Hong | 257/290 |

FOREIGN PATENT DOCUMENTS

| JP | 56-162885 A | 12/1981 |
| JP | 7-250287 A | 9/1995 |

* cited by examiner

*Primary Examiner*—Matthew E Warren
(74) *Attorney, Agent, or Firm*—Crowell & Moring LLP

(57) ABSTRACT

Each of three light receiving sections has a P-type well having a $P^+$-type layer and an N-type layer formed therein. The $P^+$-type layer is diffused from substrate surface to depth d1. A PN junction forming portion of the N-type layer is diffused from depth d1 to depth d2 which is greater than depth d1 so as to form, with the P-type well, a PN junction of a photodiode at depth d2. Depths d1 as well as depths d2 of the three light receiving sections are different from each other. The N-type layer has a charge output portion which is diffused from the PN junction to the substrate surface, and which is coupled by circuit coupling to a MOS transistor for reading out charge. This allows each light receiving section to have spectral characteristics, thereby providing a solid state imaging element and a solid state imaging device without using color filters.

12 Claims, 13 Drawing Sheets

SOLID STATE IMAGING DEVICE AND SOLID STATE IMAGING ELEMENT

BACKGROUND OF THE INVENTION

1. Field of the Invention

The present invention relates to a solid state imaging device and a solid state imaging element, more particularly to a technology of controlling spectral characteristics of light receiving sections therein.

2. Description of the Related Art

In a conventional solid state imaging element (image sensor) for a color camera (digital camera) using a single imaging element, photodiodes are formed within a silicon substrate, on which a wiring layer is formed. Color filters for spatial modulation are formed on the wiring layer, and are provided with microlenses thereon.

Typical known color filter arrays are Bayer array for a primary color filter, and difference sequential array for a complementary color filter. Here, the Bayer array is such an array that lines (rows) having alternating green (G) and red (R) areas and lines having alternating green (G) and blue (B) areas are alternately arranged in the column direction, and that the green (G) areas are not aligned in the column direction between two adjacent lines (so that when viewed as a whole, the green (G) areas form a checkered or mosaic pattern). On the other hand, the difference sequential array is such an array that lines (rows) having alternating magenta (MG) and green (G) areas and lines having alternating yellow (YE) and cyan (CY) areas are alternately arranged in the column direction.

The conventional solid state imaging element described above creates a problem in that as the cell size decreases, the thickness (height) of a structure on the photodiodes, i.e. on the silicon substrate, significantly influences the performance of the solid state imaging element. For example, if the cell size is about 2 µm (that is photodiode size of about 1 µm$^2$ with the aperture ratio being assumed as about 25%), a solid state imaging element of the CCD (Charge Coupled Device) type has a height (thickness) of about 2 µm to 3 µm from the surface of the silicon substrate to the upper surface of color filters, while a solid state image element of the CMOS (Complementary Metal Oxide Semiconductor) type has such height of about 5 µm to 6 µm. This causes that even with the aperture ration of about 25%, only a portion of incident light arrives at the photodiodes, depending on the angle of principal ray passing the microlenses. The reduction of the incident light arrival is particularly significant in the case of the solid state imaging element of the CMOS type, because it requires a thicker wiring layer than in the case of the CCD type.

As a solution to such problem, it may be considered to design a CCD type solid state imaging element so as to move and adapt the microlenses on the color filters to the angle of principal ray of the incident light. However, since such angle varies depending on the lens and zoom, this solution is limiting, and it is hard to mention this solution as being for general use. Besides, since the process of forming color filters is different from the semiconductor manufacturing process to form e.g. photodiodes, it is required to provide, for the color filters, a separate clean room and separate equipment therein such as stepper, coating equipment and cleaning equipment. This is another problem.

To solve these two problems, it is proposed to design a structure of a CMOS type solid state imaging element without using color filters as disclosed, for example, in the article by Richard F. Lyon and Paul M. Hubel, "Eyeing the Camera: into the Next Century", IS&T/SID Tenth Color Imaging Conference: Color Science and Engineering Systems, Technologies, Applications; Scottsdale, Ariz.; Nov. 12, 2002; p. 349-355. According to this structure, photodiodes are stacked in three layers in the depth direction in a silicon substrate, whereby the respective photodiodes in a single cell extract wavelength components corresponding to the respective depths thereof in the stack. In other words, the photodiodes themselves are designed to have spectral characteristics. More specifically, a blue (B) component, i.e. short wavelength component, of incident light is detected and obtained from the shallowest photodiode, i.e. positioned closest to the substrate surface, and a red (R) component, long wavelength component, of incident light is detected and obtained from the deepest photodiode positioned farthest from the substrate surface, while a green (G) component, middle wavelength component, of incident light is detected and obtained from the photodiode positioned in the middle.

However, because of the three-layer stack, this structure is complex. In addition, since it is required to provide, in a single cell, the structure for obtaining outputs from the three photodiodes, the cell necessarily becomes large in size. In other words, it is difficult to reduce the cell size. Furthermore, since the photodiodes are stacked, it is not possible to set spectral characteristics for each photodiode individually.

It should be noted that it is understood that the purpose of the three-layer stack of photodiodes according to the above cited article is not to eliminate color filters, but to avoid spatial modulation of signals due to the color filters in the conventional structure with the two-dimensionally arranged photodiodes.

SUMMARY OF THE INVENTION

An object of the present invention is to provide a solid state imaging device and a solid state image element that eliminate the need for color filters, and that achieve formation of light receiving sections capable of receiving more incident light with a simple structure which can reduce the cell size, in which the spectral characteristics can be individually set for each light receiving section.

According to a first aspect of the present invention, this object is achieved by a solid state imaging element comprising a plurality of kinds of light receiving sections for photoelectrically converting incident light to generate charge, each of the light receiving sections comprising: a first semiconductor layer of a first conduction type having a first portion diffused from a substrate surface to a first depth in a semiconductor substrate; a second semiconductor layer of a second conductor type having a PN junction-forming portion which is in contact with the first portion of the first semiconductor layer at the first depth, and which is diffused from the first depth to a second depth greater than the first depth, and further which forms a PN junction of a photodiode at the second depth in the semiconductor substrate; and a third semiconductor layer of the first conduction type for forming the PN junction at the second depth with the PN junction-forming portion of the second semiconductor layer. The first semiconductor layer has a higher impurity concentration that the third semiconductor layer, while the first depths as well as the second depths of the plurality of kinds of light receiving sections are different from each other.

According to a second aspect of the present invention, the above-described object is achieved by a solid state imaging device comprising the above-described solid state imaging element, and further comprising: a transmission section for reading out the charge, and for outputting, based on the charge, a first signal group from the plurality of kinds of light receiving sections; and a signal processing unit for generating a second signal group of a predetermined color system from the first signal group.

According to the solid state imaging element of the first aspect and the solid state imaging device of the second aspect of the present invention, the incident light arrives at the photodiode via the first semiconductor layer. Here, the depths (second depths) of the PN junctions of the plurality of kinds of light receiving sections are different from each other, so that wavelength components of light arriving at the photodiodes in the respective light receiving sections are different from each other, based on the wavelength dependence of penetration depth of light in the semiconductor (refer to FIG. 4 and FIG. 5 later). In other words, the spectral characteristics of the respective photodiodes are different from each other.

Further, the first semiconductor layer has a high impurity concentration which is higher than the third semiconductor layer. Because of the high impurity concentration, the first semiconductor layer has a small potential gradient therein. For these reasons, charge generated in the first semiconductor layer based on the photoelectric conversion is mostly recombined and extinguished, and is thus hardly read out from the light receiving section. That is, in the first semiconductor layer, light absorption occurs which does not contribute to the first signal group. In particular, because of the differences in first depth corresponding to the thickness of the first semiconductor layer among the respective light receiving sections, and based on the wavelength dependence of penetration depth of light in the semiconductor (refer to FIG. 4 and FIG. 5 later), the wavelength components of light absorbed in, or conversely passing through, the first semiconductor layers in the respective light receiving sections are different from each other. In other words, the spectral characteristics of the first semiconductor layers of the respective light receiving sections are different from each other.

Thus, according to the present invention, by the double application of the spectral characteristics based on the thicknesses of the first semiconductor layers and the spectral characteristics based on the depths of the photodiodes, the spectral characteristics of the plurality of kinds of light receiving sections can be differentiated from each other. For this reason, the solid state imaging element and the solid state imaging device according to the present invention eliminate the need for color filters. This allows the structure on the substrate surface to be thinner by the thickness of the color filters, whereby incident light can be efficiently transmitted to arrive at each photodiode in the silicon substrate, thereby increasing sensitivity.

Furthermore, it becomes possible to reduce the size of each cell, thereby providing a solid state imaging element and a solid state imaging device with reduced size, or a solid state imaging element and a solid state imaging device having a higher resolution with the cells being more densely arranged. Such effects become more pronounced with the CMOS (Complementary Metal Oxide Semiconductor) type which causes the structure on the substrate surface to be thicker than with the CCD (Charge Coupled Device) type. In addition, since no color filters are needed as described above, no equipment for producing color filters is needed, thereby achieving cost reduction.

Besides, since the first semiconductor layer has a higher impurity concentration than the third semiconductor layer, problems of the substrate surface such as crystal defects and so-called white spots caused by the crystal defects can be reduced. In other words, the first semiconductor layer according to the present invention has both the crystal defect reducing effect and the above-described spectral effect at the same time.

In addition, each of the light receiving sections is basically formed of a first semiconductor layer and a photodiode (second semiconductor layer and third semiconductor layer). Accordingly, as compared with the structure having a three-layer stack of photodiodes according to the above cited article, for example, the structure of the light receiving sections is simpler. For reading outputs (charges) from light receiving sections, the structure according to the present invention can be smaller in size than that according to the above cited article. Thus, it is easier to reduce the size of each cell. Furthermore, in contrast to the structure according to the above cited article, each of the light receiving sections according to the present invention has a single photodiode, so that the spectral characteristics of the photodiode can be individually set for each of the light receiving sections.

Preferably, the transmission section includes a MOS (Metal Oxide Semiconductor) transistor formed in each of the light receiving sections for reading out the charge, wherein the second semiconductor layer further has a charge output portion diffused from the PN junction to the substrate surface and coupled by circuit coupling (in semiconductor) to the MOS transistor for outputting the charge to the transmission section.

In this structure, the second semiconductor layer forming the photodiode has a charge output portion coupled by circuit coupling to the transmission section, so that it is possible to securely read out charge generated by the photodiode, regardless of the thickness (namely first depth) of the first portion of the first semiconductor layer which is formed closer to the substrate surface than the photodiode. In other words, the presence of the charge output portion increases the degree of freedom in the design of the thickness of the first portion of the first semiconductor layer, i.e. design of the spectral characteristics of the first semiconductor layer. A further advantage of the charge output portion, which is diffused up to the substrate surface in the light receiving section, is that as compared with the case of coupling a PN junction-forming portion of the second semiconductor layer to the MOS transistor by circuit coupling, a lower gate voltage can be used for the MOS transistor.

Preferably, the transmission section includes a MOS transistor formed in each of the light receiving sections for reading out the charge, wherein the second semiconductor layer further has a charge output portion which is diffused from the PN junction to a third depth smaller than the first depth in the semiconductor substrate, and which is coupled by circuit coupling to the MOS transistor for outputting the charge to the transmission section, and wherein the first semiconductor layer further has a second portion which is diffused from the substrate surface to the third depth, and which is in contact with the charge output portion of the second semiconductor layer at the third depth.

In this structure, the second semiconductor layer forming the photodiode has a charge output portion coupled by circuit coupling to the transmission section, so that it is possible to securely read out charge generated by the photodiode, regardless of the thickness (namely first depth) of the first portion of the first semiconductor layer which is formed closer to the substrate surface than the photodiode. In other words, the presence of the charge output portion increases the degree of freedom in the design of the thickness of the first portion of the first semiconductor layer, i.e. design of the spectral characteristics of the first semiconductor layer.

Here, as compared with the case of coupling the PN junction-forming portion of the second semiconductor layer to the MOS transistor by circuit coupling, a lower gate voltage can be used for the MOS transistor, since the thickness of the second portion of the first semiconductor layer (i.e. third depth) is smaller than the thickness of the first portion (i.e. first depth). In addition, since the first semiconductor layer has a higher impurity concentration than the third semiconductor layer, problems of the substrate surface above the charge output portion, such as crystal defects and leak current caused by the crystal defects, can be reduced by the second portion of the first semiconductor layer.

Preferably, the first semiconductor layer is formed of: a third portion which is a portion of the first portion from the third depth to the first depth; and a fourth portion which is formed of the second portion and a portion of the first portion from the substrate surface to the third depth, wherein the impurity concentrations of the third portion and the fourth portion are set to be different from each other. This makes it possible to enhance the effect of reducing the problems of the substrate surface in the first semiconductor layer such as crystal defects and leak current caused by the crystal defects, since the impurity concentration of the fourth portion in the first semiconductor layer on the substrate surface side is particularly high. Further, by controlling the thickness of the third portion (difference between the first and third depths), the spectral characteristics based on the thickness of the first semiconductor layer can be controlled.

Preferably, the number of the plurality of kinds of light receiving sections is greater than the number of colors of the predetermined color system. This makes it possible to generate the second signal group of the predetermined color system by using more wavelength components of incident light, thereby improving color reproducibility.

Preferably, each of the plurality of kinds of light receiving sections has a larger light receiving area with a greater second depth. This makes it possible to generate more charge by a light receiving section having a greater second depth. Generally, incident light penetrating into the silicon substrate/layer from the substrate surface becomes weaker as the penetration depth (distance) from the substrate surface increases. Accordingly, as the second depth increases, i.e. as the position of the PN junction of the photodiode is deeper, the amount of generated charge decreases. Thus, the increase of the light receiving area with the increase of the second depth makes it possible to increase the amount of generated charge as described above, whereby it becomes possible to correct or adjust the levels of signals among the different kinds of light receiving sections, thereby achieving a resultant reproduced image of high quality.

Further preferably, each of the plurality of kinds of light receiving sections has a larger area of PN junction with a larger light receiving area. This area adjusting method is advantageous over e.g. the method of adjusting a light shielding layer with each area of PN junction being set to be the same, because the entire area which the light receiving sections according to the PN junction area adjustment method occupy in the solid state imaging element can be smaller than that according to the light shielding layer adjustment method, thereby achieving cost reduction or higher resolution of the solid state imaging device.

According to a third aspect of the present invention, the above-described object is achieved by a solid state imaging device comprising: a plurality of kinds of light receiving sections for photoelectrically converting incident light to generate charge; a transmission section including a MOS transistor for reading out the charge and an amplifier for amplifying the read out charge, which are provided in each of the light receiving sections, so as to output the amplified charge as a first signal group based on the charge from the plurality of kinds of light receiving sections; and a signal processing unit for generating a second signal group of a predetermined color system from the first signal group.

Each of the plurality of kinds of light receiving sections comprises: a first semiconductor layer of a first conduction type having a first portion diffused from a substrate surface to a first depth in a semiconductor substrate; a second semiconductor layer of a second conductor type having (i) a PN junction-forming portion which is in contact with the first portion of the first semiconductor layer at the first depth, and which is diffused from the first depth to a second depth greater than the first depth, and further which forms a PN junction of a photodiode at the second depth in the semiconductor substrate, and (ii) a charge output portion diffused from the PN junction to the substrate surface and coupled by circuit coupling to the MOS transistor for outputting the charge to the transmission section; and a third semiconductor layer of the first conduction type for forming the PN junction at the second depth with the PN junction-forming portion of the second semiconductor layer. The first semiconductor layer has a higher impurity concentration that the third semiconductor layer, while the first depths as well as the second depths of the plurality of kinds of light receiving sections are different from each other.

Similarly as in the solid state imaging device of the second aspect of the present invention, the solid state imaging device according to the third aspect of the present invention makes it possible to differentiate the spectral characteristics of the plurality of kinds of light receiving sections from each other by the double application of the spectral characteristics based on the thicknesses of the first semiconductor layers and the spectral characteristics based on the depths of the photodiodes. For this reason, the solid state imaging device eliminates the need for color filters. This makes it possible to obtain the above-described effects of cost reduction and increased sensitivity of the solid state imaging device as well as reduced size or increased resolution of the solid state imaging device based on the cell size reduction. Further, the first semiconductor layer according to the third aspect of the present invention has both the crystal defect reducing effect and the spectral effect at the same time.

Furthermore, as compared with the structure according to the above cited article, for example, the structure of the light receiving sections according to the third aspect of the present invention is simpler. For reading outputs (charges) from light receiving sections, the structure according to the third aspect can be smaller in size than that according to the above cited article. Thus, it is easier to reduce the size of each cell, and the spectral characteristics of the photodiode can be individually set for each of the light receiving sections. In addition, the presence of the charge output portion of the second semiconductor layer makes it possible to securely read out charge generated by the photodiode, i.e. increases the degree of freedom in the spectral characteristics of the first semiconductor layer. A further advantage of the charge output portion, which is diffused up to the substrate surface in the light receiving section, is that as compared with the case of coupling a PN junction-forming portion of the second semiconductor layer to the MOS transistor by circuit coupling, a lower gate voltage can be used for the MOS transistor.

In summary, the solid state imaging element and the solid state image device according to the present invention eliminate the need for color filters, and achieve formation of light receiving sections capable of receiving more incident light with a simple structure which can reduce the cell size, in which the spectral characteristics can be individually set for each light receiving section.

While the novel features of the present invention are set forth in the appended claims, the present invention will be better understood from the following detailed description taken in conjunction with the drawings.

BRIEF DESCRIPTION OF THE DRAWINGS

The present invention will be described hereinafter with reference to the annexed drawings. It is to be noted that all the drawings are shown for the purpose of illustrating the technical concept of the present invention or embodiments thereof, wherein:

FIG. 14A is a schematic plan view showing and explaining a basic arrangement of the light receiving sections in the solid state imaging element unit according to Embodiment 2 of the present invention as well as areas and shapes of light receiving surfaces of the light receiving sections, while

FIG. 16A is a schematic plan view showing and explaining a basic arrangement of light receiving sections in a solid state imaging element unit for comparison as well as areas and shapes of light receiving surfaces of such light receiving sections, while

DESCRIPTION OF THE PREFERRED EMBODIMENTS

Figure 1:
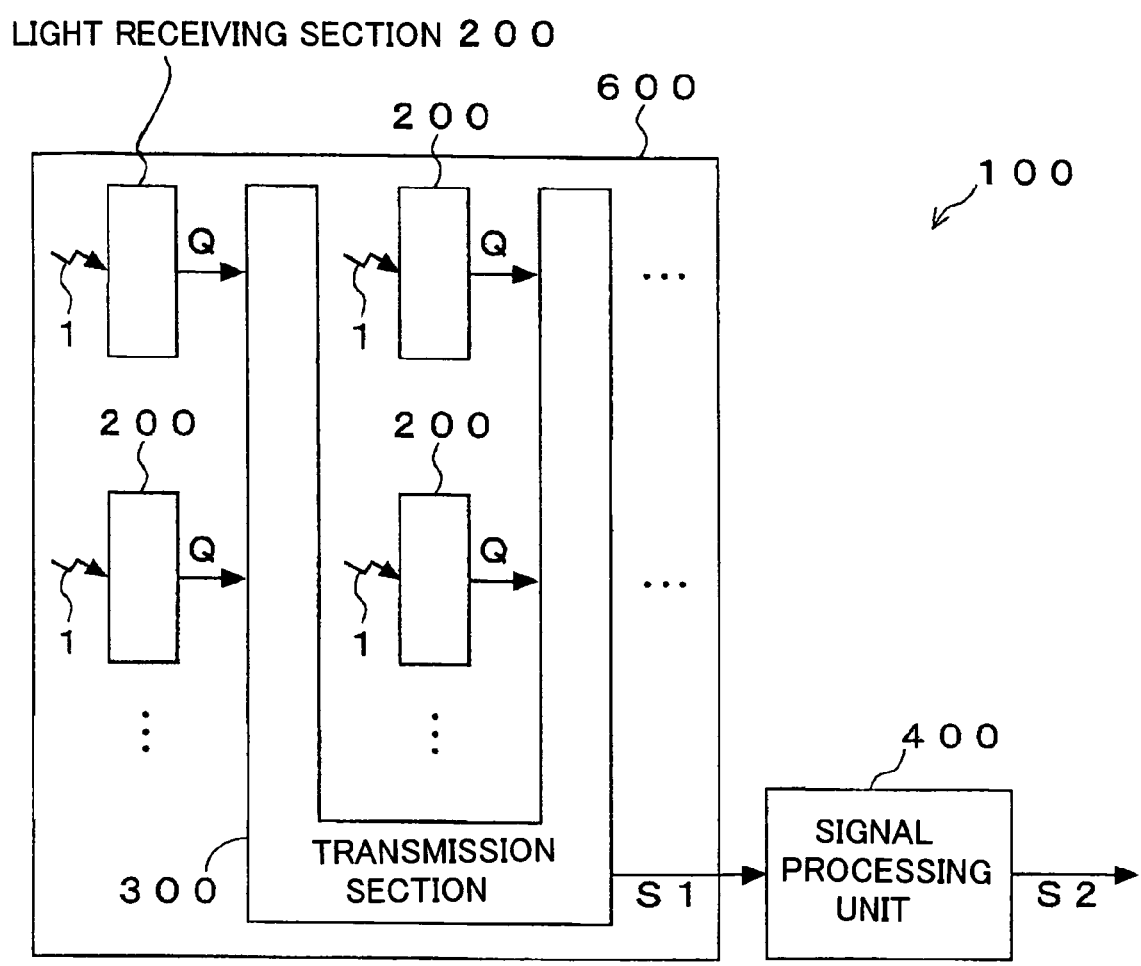
FIG. 1 is a schematic block diagram of a solid state imaging device according to Embodiment 1 of the present invention.

Embodiments of the present invention, as best mode for carrying out the invention, will be described hereinafter with reference to the drawings. It is to be understood that the embodiments described herein are not intended as limiting, or encompassing the entire scope of, the present invention. Note that like parts are designated by like reference numerals or characters throughout the drawings.

Embodiment 1

FIG. 1 is a schematic block diagram of a solid state imaging device 100 according to Embodiment 1 of the present invention. As shown in FIG. 1, the solid state imaging device 100 includes a solid state imaging element unit 600 having a solid state imaging element (image sensor), and also includes a signal processing unit 400. The solid state imaging element unit 600 includes a plurality of light receiving sections 200 arranged in a two-dimensional matrix as well as a transmission section 300.

Each light receiving section 200 photoelectrically converts incident light 1 to generate charge Q. The transmission section 300 reads out the charges Q in the respective light receiving sections 200, and outputs the charges Q to the signal processing unit 400 as a first signal (first signal group) S1 each based on the charge Q. On the other hand, the signal processing unit 400 converts the first signal S1 to a second signal (second signal group) S2 of a predetermined color system (or color reproduction system) based on a format such as NTSC (National Television System Committee), three primary color system suitable for signal processing by a digital camera (color camera), or complementary color system suitable for printing, and outputs the second signal S2. The solid state imaging device 100 will be described in more detail below.

Figure 2:
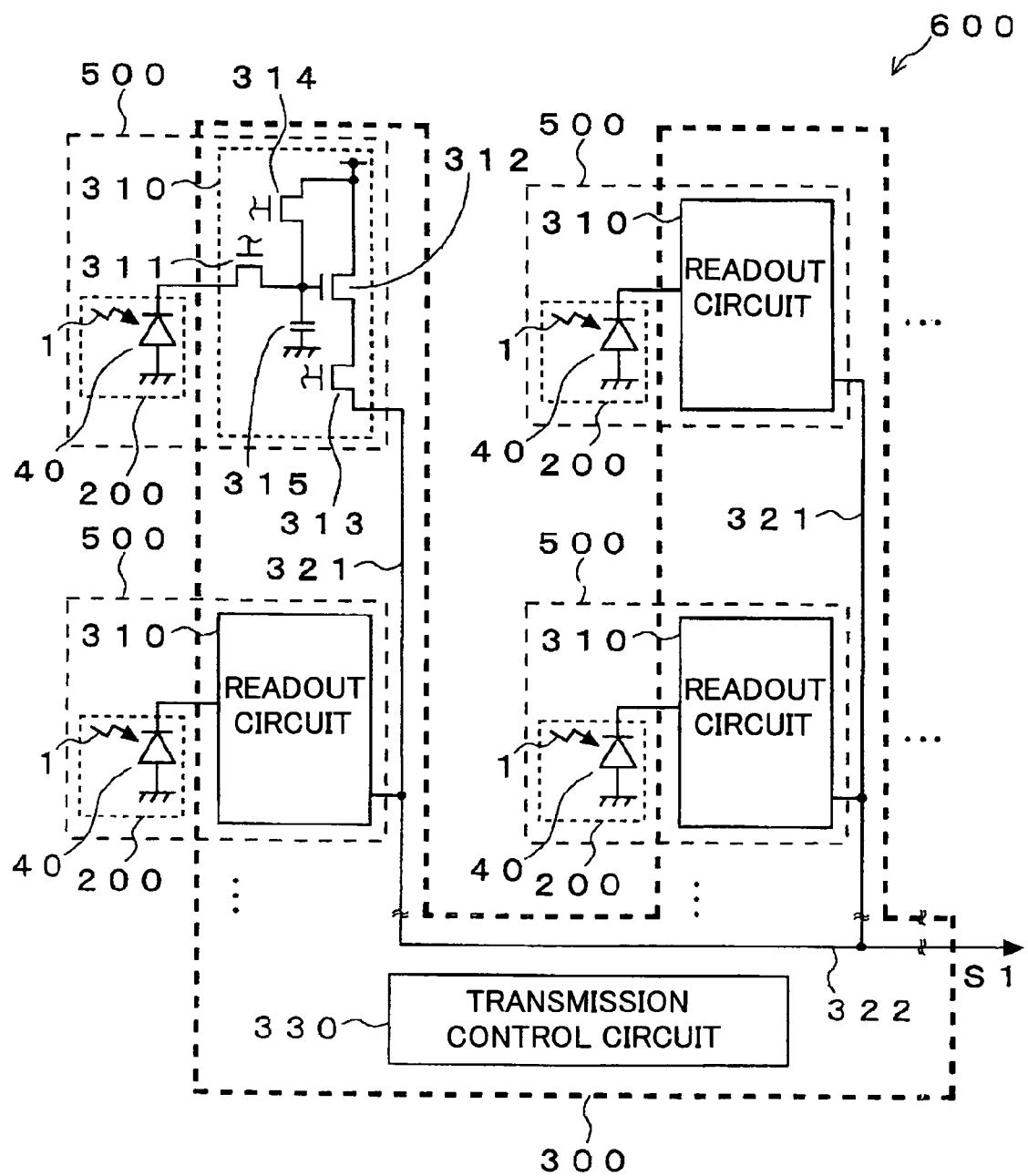
FIG. 2 is a schematic circuit diagram, partially in block form, of a solid state imaging element unit according to Embodiment 1 of the present invention.

FIG. 2 is a schematic circuit diagram, partially in block form, of the solid state imaging element unit 600 according to Embodiment 1 of the present invention. As shown in FIG. 2, the solid state imaging element unit 600 has a so-called CMOS (Complementary Metal Oxide Semiconductor) type solid state imaging element. Note that the solid state imaging element unit 600 can be manufactured by a well-known semiconductor manufacturing technology.

More specifically, each light receiving section 200 includes a photodiode 40 having an anode connected to ground, and a cathode connected to a readout circuit 310 in the transmission section 300

The transmission section 300 includes the readout circuit 310, transmission paths 321, 322 and a transmission control circuit 330. Each light receiving section 200 is provided with a readout circuit 310, and a combination of the light receiving section 200 and the readout circuit 310 forms a cell 500. One transmission path 321 is provided for a plurality of predetermined readout circuits 310 (in the case of FIG. 2, readout circuits 310 arranged in the column direction, or longitudinal direction on the paper). Each transmission path 321 is connected to outputs (terminals) of the plurality of corresponding readout circuits 310 as described above. One end of each transmission path 321 is connected to the transmission path 322, so that the first signal S1 comprising signals from the respective light receiving sections 200 is output from the transmission section 300.

Note that the transmission paths 321, 322 here are formed of wiring such as metal wiring, but one or both of the transmission paths 321, 322 can be formed of, for example, CCD transmission paths. Also note that one transmission path 322 is used here, but it is possible to provide transmission paths 322 for the transmission paths 321, respectively, so as either to read out the charges or signals from the light receiving sections in parallel which are arranged in the line (row) direction (lateral direction on the paper), or to read out the charges or signals from the light receiving sections for each column which are arranged in the column direction.

Each readout circuit 310 comprises: a read transistor 311 for reading out charge Q; an amplifying transistor 312 as an amplifier; a selecting transistor 313 for selecting the cell 500; a reset transistor 314; and a floating diffusion (FD) 315. Note that the transistors 311, 312, 313, 314 here are MOS (Metal Oxide Semiconductor) transistors.

The cathode of the photodiode 40 is connected to the source of the read transistor 311, while the drain of the read transistor 311 is connected to the gate of the amplifying transistor 312. The drain of the amplifying transistor 312 is connected to a predetermined potential, while the source of the amplifying transistor 312 is connected to the drain of the selecting transistor 313. The source of the selecting transistor 313 is connected to the transmission path (wiring) 321. Further, the source and the drain of the reset transistor 314 are connected to the drain of the read transistor 311 and the above-described predetermined potential, respectively, while the FD 315 is connected between the drain of the read transistor 311 and ground potential. Besides, the timing of applying voltages to the respective gates of the transistors 311, 313, 314 is controlled by the transmission control circuit 330, although signal lines between them are not shown in FIG. 2 for clarity of the drawing.

According to each such readout circuit 310, the charge Q generated by the photodiode 40 of the light receiving section 200 is read out via the read transistor 311 therein, so that such readout circuit 310 generates a signal of the light receiving section 200 based on the read out charge Q (more specifically on such charge Q as amplified by the amplifying transistor 312). Such signal is output to the transmission path 321 via the selecting transistor 313.

It is to be noted that the readout circuit 310 shown in FIG. 2 is only an example, and readout circuits with other structures can be used. Furthermore, it is also possible to use a CCD structure, in place of the CMOS structure, for each of the readout circuit 310 and the transmission paths 321, 322 so as to form a CCD type solid state imaging element for the solid state imaging element unit 600.

Figure 3:
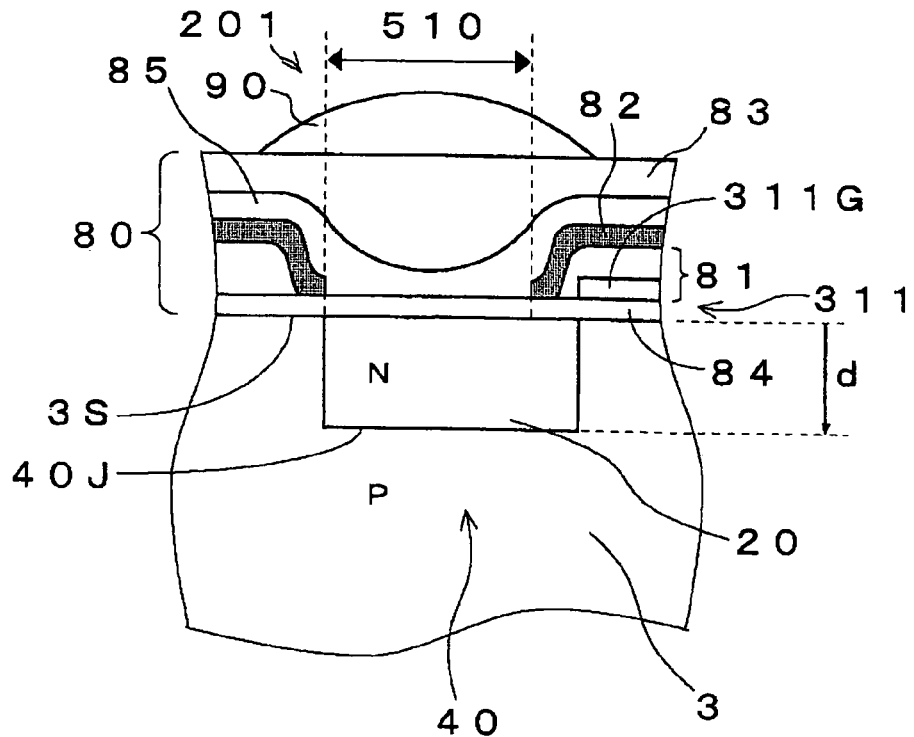
FIG. 3 is a schematic cross-sectional view of a basic light receiving section according to a basic structure of the light receiving section of Embodiment 1 of the present invention.

Now, a basic structure of the light receiving section 200 will be described below with reference to FIG. 3 before describing the structure of the light receiving section 200 according to the present invention. FIG. 3 is a schematic cross-sectional view of a basic light receiving section 201 according to the basic structure.

Referring to FIG. 3, the basic light receiving section 201 with the basic structure has a P-type silicon substrate 3 in which an N-type silicon layer 20 is diffused from substrate surface 3S to a predetermined depth d (meaning that an N-type impurity is diffused therein or added thereto to form the N-type silicon layer 20). The P-type silicon substrate 3 and the N-type silicon layer 20 form a photodiode 40. Note that although not specifically shown in FIG. 3, the basic light receiving section 201 is assumed to be incorporated in such a single cell 500 as shown in FIG. 2, in which a photodiode 40 and a readout circuit 310 (refer to FIG. 2) are formed adjacent to each other, and further source regions and drain regions of transistors 311, 312, 313, 314 are formed adjacent to the photodiode 40 within the substrate surface 3S.

On the other hand, a surface layer 80 comprising an insulating layer 84, a wiring layer 81, a light shielding layer 82, a protective film 85 and a flattening layer 83 is formed on the substrate surface 3S. The N-type silicon layer 20 has an aperture area (or opening portion) 510 on an upper surface thereof (on the substrate surface 3S) for collecting incident light into the photodiode 40 in the cell 500 (refer to FIG. 2), while the wiring layer 81 is formed in an area other than the aperture area.

The insulating layer 84 is formed on the entire substrate surface 3S. The wiring layer 81 has e.g. wirings formed on the insulating layer 84 and within the surface layer 80 to form the transmission paths 321, 322 of the transmission section 300 (refer to FIG. 2). As a portion of the wiring layer 81, for example, a gate electrode 311 G of the read transistor 311 is formed on the insulating layer 84 and adjacent to the N-type silicon layer 20 in order to allow the N-type silicon layer 20 to serve as the source region of such transistor 311.

The light shielding layer 82 is provided to prevent incident light from entering regions other than the photodiode 40, and thus can be said to define the aperture area 510. In the example of FIG. 3, the light shielding layer 82 is formed on and covers the upper surface and the inner side surface of the wiring layer 81 in order to prevent light from entering the wiring layer 81.

The protective film 85 forms a transparent layer to cover the surface of the light shielding layer 82 and the aperture area 510 so as to protect the wiring layer 81 and the light shielding layer 82. The flattening layer 83 is formed on the protective film 85, and a microlens 90 is formed on the flat surface of the flattening layer 83. The microlens 90 is formed to face the N-type silicon layer 20 and to overlap the aperture area 510. The basic light receiving section 201 having the structure described above comprises the photodiode 40, the microlens 90 and a portion of the surface layer 80 between them within and defined by the aperture area 510.

Figure 4:
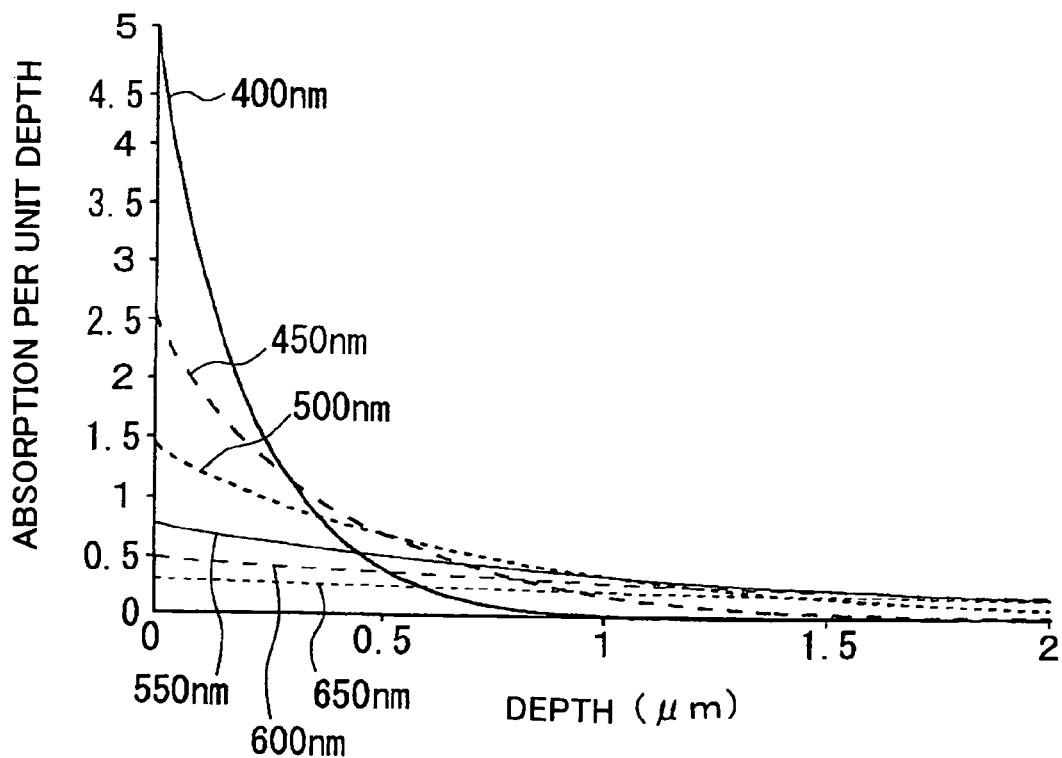
FIG. 4 is a graph showing absorption characteristics for different wavelengths of light which penetrates into and is absorbed in a silicon substrate/layer.
Figure 5:
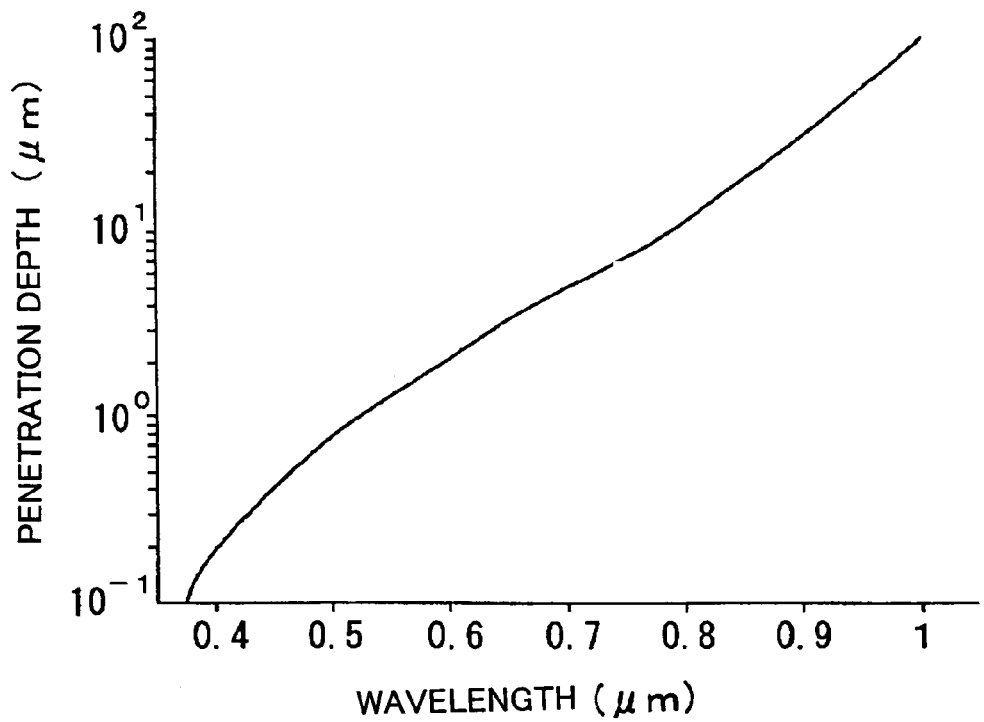
FIG. 5 is a graph showing wavelength dependence of penetration depth of light.

FIG. 4 is a graph showing absorption characteristics for different wavelengths of light which penetrates into and is absorbed in the silicon substrate/layer, where the vertical axis represents absorption per unit depth, and the horizontal axis represents depth. As shown in FIG. 4, the absorption of light incident on the silicon substrate/layer increases, and the light intensity attenuates as the depth of light penetrating into the silicon substrate/layer increases. It can further be seen from FIG. 4 that an absorption factor (attenuation factor) near the surface of the silicon substrate/layer is higher with light of a shorter wavelength, so that the light penetration is limited to a smaller depth. Conversely, the absorption factor (attenuation factor) near the surface of the silicon substrate/layer is lower with light of a longer wavelength, so that the light penetrates to a greater depth. FIG. 5 is a graph showing wavelength dependence of penetration depth of light as generated from the characteristics shown in FIG. 4.

The present inventors have found that in view of such characteristics, it is possible to control the spectral characteristics (or sensitivity spectrum) of the photodiode 40, and hence of the basic light receiving section 201 shown in FIG. 3, by controlling the depth d of PN junction 40J of the photodiode 40 which serves to generate charge Q based on the photoelectric conversion, thereby making it possible to eliminate the need for color filters.

Now, it is assumed that the basic light receiving section 201 is used for the light receiving section 200 in the solid state imaging element unit 600 (refer to FIG. 1 and FIG. 2), and that the depth d of the PN junction 40J of the photodiode 40 (refer to FIG. 3) is varied to provide three different kinds of basic light receiving sections 201B, 201CY, 201W as will be described below with reference to FIG. 6.

Figure 6:
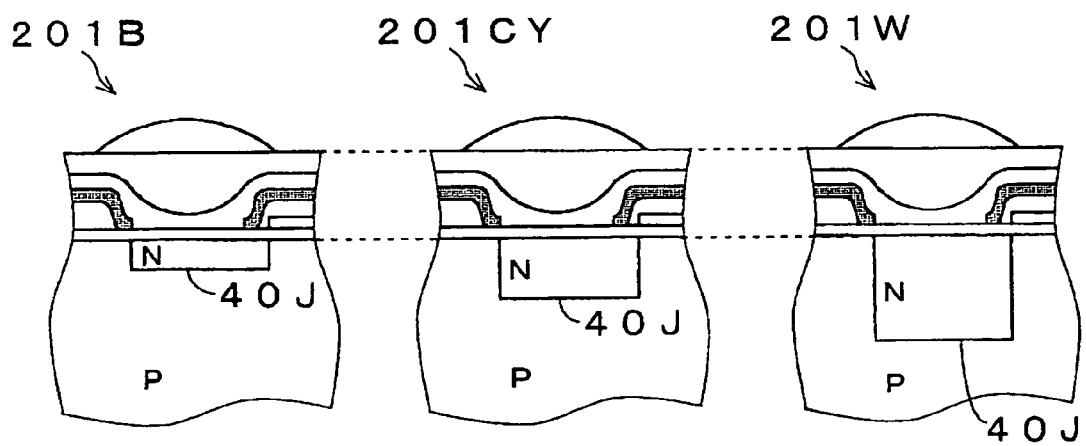
FIG. 6 is a schematic cross-sectional view of different kinds of basic light receiving sections according to the basic structure.

Referring to FIG. 6, which is a schematic cross-sectional view of different kinds of basic light receiving sections 201B, 201CY, 201W according to the basic structure, the basic light receiving section 201B has a PN junction 40J at a depth of about 0.3 μm to 0.4 μm, and thereby causes accumulation of charge generated (excited) by light with a light component having a wavelength of about 400 nm to 500 nm in the incident light, so that a signal of a blue (B) wavelength component in the incident light is extracted therefrom. Similarly, the basic light receiving section 201CY has a PN junction 40J at a depth of about 0.5 μm to 0.6 μm, and thereby causes accumulation of charge generated by light with a light component having a wavelength of about 400 nm to 600 nm in the incident light, so that in addition to the signal of the blue (B) wavelength component, a signal of a green (G) wavelength component in the incident light is extracted therefrom. That is, a signal of a cyan (CY) wavelength component, which is a composite component (B+G) of blue (B) and green (G), is extracted.

Similarly, the basic light receiving section 201W has a PN junction 40J at a depth of about 0.8 μm to 1.2 μm, and thereby causes accumulation of charge generated by light with a light component having a wavelength of about 400 nm to 700 nm in the incident light, so that in addition to the signals of the blue (B) wavelength component and green (G) wavelength component, a signal of a red (R) wavelength component in the incident light is extracted therefrom. That is, a signal of a white (W) wavelength component, which is a composite component (B+G+R) of blue (B), green (G) and red (R), is extracted.

Figure 7:
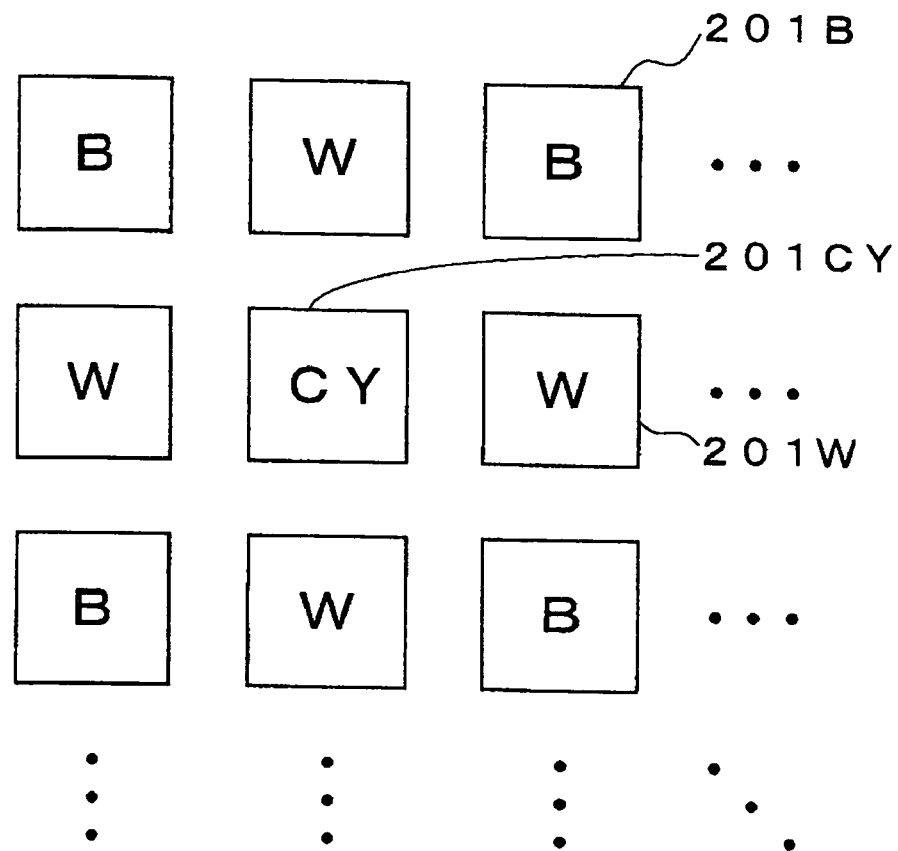
FIG. 7 is a schematic plan view showing and explaining a basic arrangement of the basic light receiving sections in the solid state imaging element unit.

FIG. 7 is a schematic plan view showing and explaining a basic arrangement of the above-described three kinds of basic light receiving sections 201B, 201CY, 201W in a solid state imaging element unit 600 (refer to FIG. 1). As shown in FIG. 7, the basic light receiving sections 201B, 201CY, 201W are arranged in a two-dimensional matrix as a whole. More specifically, such matrix can be divided broadly into lines having two kinds of basic light receiving sections 201W, 201B alternating in the line (row) direction (lateral direction on the paper in FIG. 7), and lines having two kinds of basic light receiving sections 201W, 201CY alternating in the line direction. These two kinds of lines are alternately arranged in the column direction (longitudinal direction on the paper in FIG. 7). Here, the two kinds of lines are so arranged that the basic light receiving sections 201W, which have the widest bandwidth among the three kinds of basic light receiving sections 201B, 201CY, 201W, form a zigzag pattern between two adjacent lines (so that when the matrix is viewed as a whole, the basic light receiving sections 201W form a checkered or mosaic pattern).

Charges Q generated in the three kinds of basic light receiving sections 201B, 201CY, 201W based on the photoelectric conversion are read out to the transmission section 300. More specifically, referring also to FIG. 2, the transmission control circuit 330 controls the read transistor 311 and the selecting transistor 313 so as to sequentially select (scan) the lines of the basic light receiving sections 201W, 201B and the lines of the basic light receiving sections 201W, 201CY, and to read out the charges Q from the basic light receiving sections, either 201W, 201B or 201W, 201CY, in each selected line. Thus, from each line of the basic light receiving sections 201W, 201B, a signal Sw (refer to FIG. 8 later) of the white (W) wavelength component and a signal Sb (refer to FIG. 8 later) of the blue (B) wavelength component are extracted and spatially modulated, and are then serially output from the transmission section 300. Similarly, from each line of the basic light receiving sections 201W, 201CY, a signal Sw (refer to FIG. 8 later) of the white (W) wavelength component and a signal Scy (refer to FIG. 8 later) of the cyan (CY) wavelength component are extracted and spatially modulated, and are then serially output from the transmission section 300.

Figure 8:
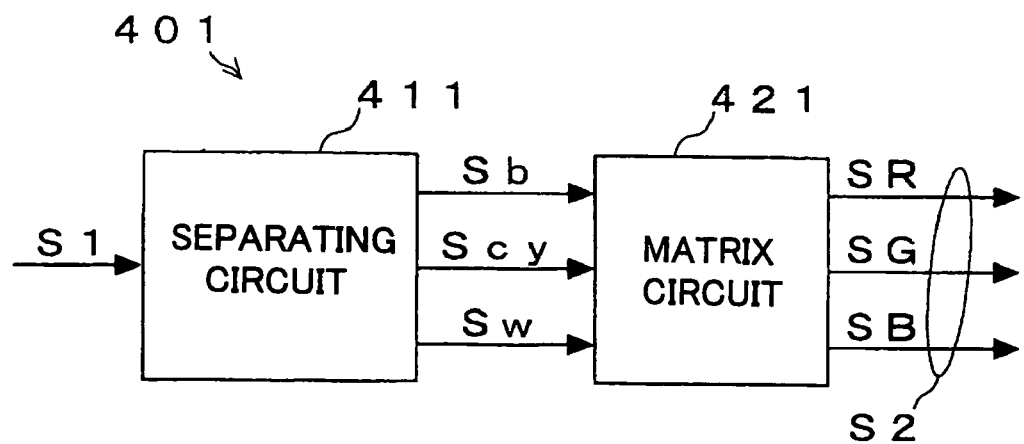
FIG. 8 is a schematic block diagram of a signal processing unit which is for the basic light receiving sections, and which corresponds to a signal processing unit in FIG. 1.

FIG. 8 is a schematic block diagram of a signal processing unit 401 which is for the basic light receiving sections 201 (201B, 201CY, 201W), and which corresponds to the signal processing unit 400 of FIG. 1. Referring to FIG. 8 in conjunction with FIG. 1, the first signal S1 output from the transmission section 300 is a generic term for the signals Sb, Scy, Sw regardless of whether serial or parallel, so that the first signal S1 can be referred to as "first signal group S1". The signal processing unit 401 is used to process the first signal group S1 composed of the signals Sb, Scy, Sw, in which the signal processing unit 401 comprises a separating circuit 411 and a matrix circuit 421.

The separating circuit 411 separates the first signal group S1 composed of the serially output signals Sb, Scy, Sw into the respective signals Sb, Scy, Sw by using e.g. a sampling method. The matrix circuit 421 converts the signals Sb, Scy, Sw obtained by the separation to a second signal (second signal group) S2 of a predetermined color system such as three primary color signals SR, SG, SB required for signal processing in a digital camera. Here, the second signal group S2 is a generic term for the three signals SR, SG, SB, so that the second signal S2 can be referred to as "second signal group S2". For example, by conversion using equations:

$$Sw - K1 \times Scy = SR$$

$$Scy - K2 \times Sb = SG$$

$$Sb = SB$$

where K1, K2 are conversion coefficients, the signals SR, SG, SB can be obtained.

Figure 9:
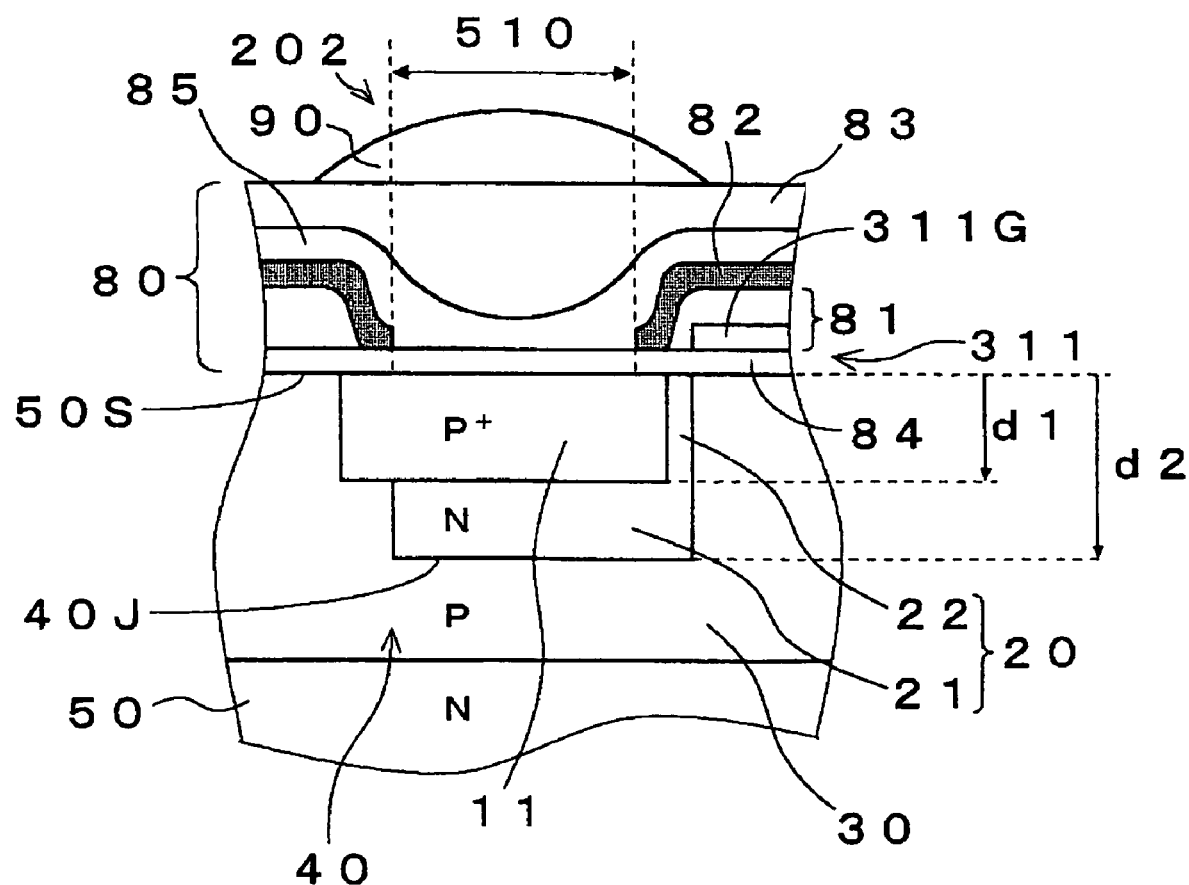
FIG. 9 is a schematic cross-sectional view of a light receiving section according to Embodiment 1 of the present invention.

FIG. 9 is a schematic cross-sectional view of a light receiving section 202 according to the present Embodiment 1 which corresponds to the light receiving section 200 (refer to FIG. 1 and FIG. 2). Referring to FIG. 9, the light receiving section 202 includes an N-type silicon substrate 50 as a semiconductor substrate having formed therein: a $P^+$-type silicon layer 11 as a first portion (main portion) of a first semiconductor layer of a first conduction type; an N-type silicon layer 20 as a second semiconductor layer of a second conduction type; and a P-type silicon layer 30 as a third semiconductor layer of the first conduction type. Note that the $P^+$-type silicon layer 11 has a higher impurity concentration than the P-type silicon layer 30.

In the following descriptions, the silicon substrate 50 will be referred to simply as "substrate 50", while the $P^+$-type silicon layer 11, the N-type silicon layer 20 and the P-type silicon layer 30 will be referred to simply as "$P^+$-type layer 11", "N-type layer 20" and "P-type layer 30", respectively. Note that similarly as in the case of the basic light receiving section 201 according to the basic structure (refer to FIG. 3), the light receiving section 202 further comprises a microlens 90 and a portion of the surface layer 80 within and defined by an aperture area 510 which are formed on the substrate 50, while the substrate 50 further has formed thereon various elements for the surface layer 80 and a transmission section 300. However, their detailed description is omitted here for brevity because they are similar.

Referring again to FIG. 9, the P-type layer 30 is diffused into the N-type substrate 50 from a substrate surface 50S to a predetermined depth (which is greater than depths d1, d2 described later) to form a P-type well. Further, the P$^+$-type layer 11 is diffused into the P-type layer 30 (P-type well) from the substrate surface 50S to a depth (first depth) d1. The N-type layer 20 is also formed in the P-type layer 30 (P-type well), in which the N-type layer comprises a PN junction-forming portion 21 and a charge output portion 22.

More specifically, the PN junction-forming portion 21 of the N-type layer 20 is positioned beneath the P$^+$-type layer 11 (position farther from the substrate surface 50S), and is diffused from a depth d1 to a depth (second depth) d2 which is greater than the depth d1. The PN junction-forming portion 21 is in contact with the P$^+$-type layer 11 at the depth d1, while it is in contact with the P-type layer 30 at the depth d2 so as to form a PN junction 40J with the P-type layer 30 (P-type well). Thus, the P-type layer 30 and the N-type layer 20 (its PN junction-forming portion 21) form a photodiode 40. Note that the depth d1 can also be taken as a thickness of the P$^+$-type layer 11, so that it will sometimes also be expressed as "thickness d1 (of the P$^+$-type layer 11)" using the same character d1. Further, the depth d2 will sometimes also be referred to as "PN junction depth d2" or simply "junction depth d2".

On the other hand, the charge output portion 22 of the N-type layer 20 is contiguous to the PN junction-forming portion 21, and is diffused toward the substrate surface 50S. In a broad sense, it can be said that the charge output portion 22 is diffused up to a position shallower than the depth d1. In the case of the light receiving section 202, in particular, the charge output portion 22 is diffused up to the substrate surface 50S. The charge output portion 22 is in contact with a side surface of the P$^+$-type layer 11. Note that in an area of the N-type layer 20 other than the charge output portion 22, the P$^+$-type layer 11 is positioned above the PN junction-forming portion 21 of the N-type layer 20 as seen in the cross-section (refer to FIG. 9).

The charge output portion 22 serves as a source region of a read transistor 311 of a transmission section 300 (refer to FIG. 1 and FIG. 2), so that a gate electrode 311G of the transistor 311 is formed near the charge output portion 22. That is, the charge output portion 22 is coupled by circuit coupling (electrically) to the read transistor 311 of the transmission section 300. Thus, charge Q generated by the photodiode 40 based on the photoelectric conversion can be output from the charge output portion 22 to the transmission section 300 via the read transistor 311.

Figure 10:
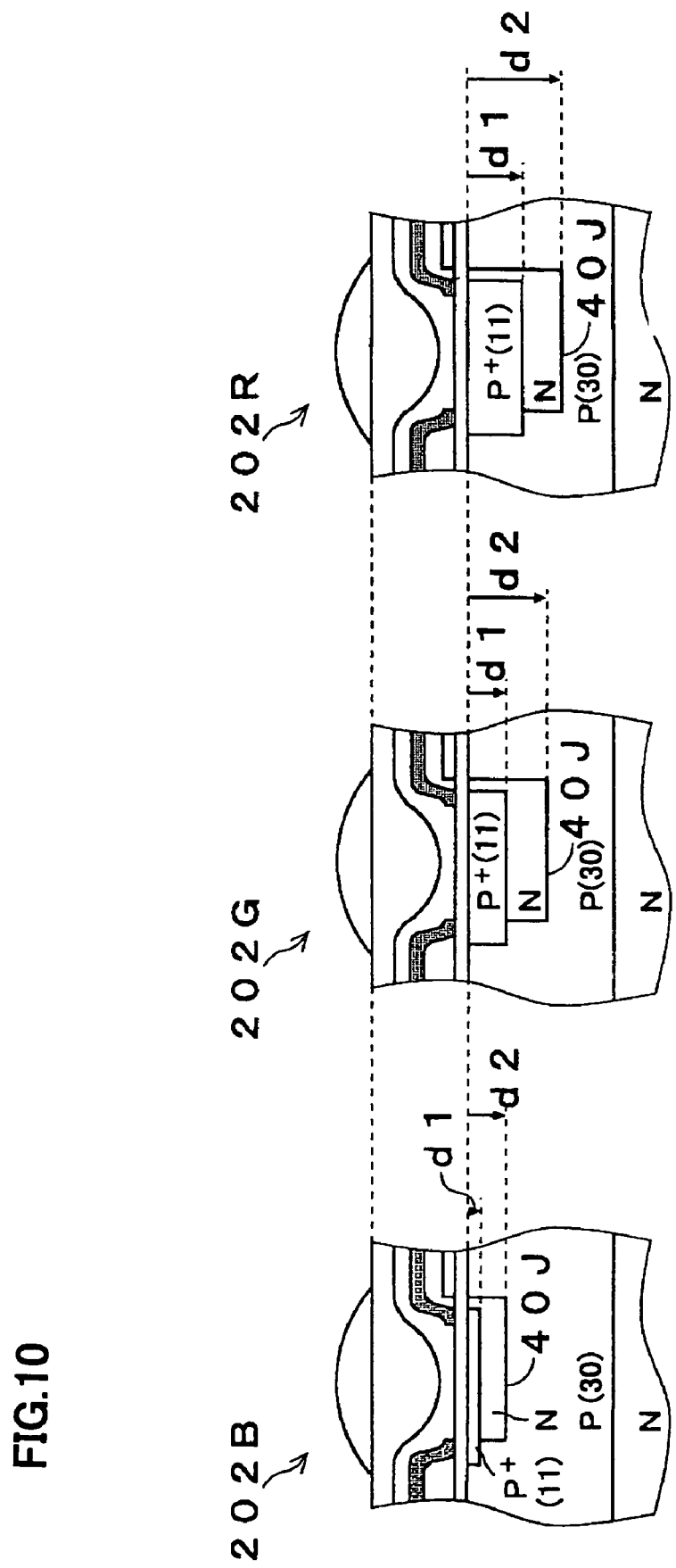
FIG. 10 is a schematic cross-sectional view of different kinds of light receiving sections according to Embodiment 1 of the present invention.

Reference is now made to FIG. 10 which is a schematic cross-sectional view of different kinds of light receiving sections 202B, 202G, 202R according to the present Embodiment 1. As shown in FIG. 10, the light receiving section 202 is classified into three kinds of light receiving sections 202B, 202Q 202R, which have thicknesses d1 (i.e. depths d1) of P$^+$-type layer 11 different from each other, and have depths d2 of PN junction different from each other.

More specifically, first, wavelength components of light arriving at the photodiodes 40 in the respective light receiving sections 202B, 202G, 202R are different from each other similarly as in the case of the above-described basic light receiving section 201 (refer to FIG. 3), because of the differences in the depth d2 of the PN junction 40 of the photodiode 40 among the different kinds of light receiving sections 202B, 202G, 202R, and based on the wavelength dependence of penetration depth of light in the semiconductor (refer to FIG. 4 and FIG. 5). In other words, the spectral characteristics (sensitivity spectra) of the photodiodes 40 of the respective light receiving sections 202B, 202G, 202R are different from each other.

Further, the P$^+$-type layer 11 has a high impurity concentration, higher than the P-type layer 30. Because of the high impurity concentration, the P$^+$-type layer 11 has a small potential gradient therein. For this reason, charge generated in the P$^+$-type layer 11 based on the photoelectric conversion is recombined and extinguished in the P$^+$-type layer 11, and is thus hardly read out from the light receiving section 202. That is, in the P$^+$-type layer 11, light absorption occurs which does not contribute to the first signal group S1 to be output from the transmission section. In particular, because of the differences in thickness d1 of the P$^+$-type layer 11 among the respective light receiving sections 202B, 202G, 202R, and based on the wavelength dependence of penetration depth of light in the semiconductor (refer to FIG. 4 and FIG. 5), it is understood that the wavelength components of light absorbed in, or conversely passing through, the P$^+$-type layers 11 in the respective light receiving sections 202B, 202G, 201R are different from each other. In other words, the spectral characteristics (sensitivity spectra) of the P$^+$-type layers 11 of the respective light receiving sections 202B, 202G, 202R are different from each other.

The lights incident on the light receiving sections 202B, 202Q 202R arrive at the respective photodiodes 40 via the respective P$^+$-type layers 11, so that by the double application of the spectral characteristics based on the thicknesses of the P$^+$-type layers 11 and the spectral characteristics based on the depths of the photodiodes 40, the spectral characteristics (sensitivity spectra) of the three kinds of light receiving sections 202B, 202G, 202R can be differentiated from each other. For this reason, the use of the light receiving sections 202B, 202G, 202R eliminates the need for color filters.

The spectral characteristics of the light receiving section 202 can be calculated by deducting the spectral characteristics of the P$^+$-type layer 11 from the spectral characteristics of the basic light receiving section 201 (refer to FIG. 3), which has the PN junction 40J at the same depth d2 as that of the light receiving section 202. Note that the dynamic range of the resultant solid state imaging element unit 600, which is one of the important performances of the solid state imaging element unit 600, can be increased by increasing the thickness of the PN junction-forming portion 21 of the N-type layer 20.

Besides, since the P$^+$-type layer 11 has a higher impurity concentration than the P-type layer 30, problems of the substrate surface 50S such as crystal defects and so-called white spots caused by the crystal defects can be reduced by the P$^+$-type layer 11. In other words, the P$^+$-type layer 11 has both the crystal defect reducing effect and the above-described spectral effect at the same time.

The following is an exemplary set of parameters of the respective light receiving sections 202B, 202G, 202R. For example, the light receiving section 202B has a depth d1 of about 0.1 μm to 0.3 μm, and a junction depth d2 of about 0.4 μm to 0.6 μm, with the PN junction-forming portion 21 of the N-type layer 20 being of a thickness of about 0.3 μm. Thus, according to the light receiving section 202B, charge Q generated (excited) by light having a wavelength component of about 400 nm to 500 nm in the incident light is extracted therefrom as a signal of a blue (B) wavelength component.

Similarly, the light receiving section 202G has a depth d1 of about 0.4 μm, and a junction depth d2 of about 0.7 μm, with the PN junction-forming portion 21 of the N-type layer 20 being of a thickness of about 0.3 µm to 0.4 µm. Thus, according to the light receiving section 202G, charge Q generated (excited) by light having a wavelength component of about 500 nm to 600 nm in the incident light is extracted therefrom as a signal of a green (G) wavelength component.

Similarly, the light receiving section 202R has a depth d1 of about 0.8 µm, and a junction depth d2 of about 1.0 µm, with the PN junction-forming portion 21 of the N-type layer 20 being of a thickness of about 0.3 µm to 0.4 µm. Thus, according to the light receiving section 202R, charge Q generated (excited) by light having a wavelength component of about 550 nm to 700 nm in the incident light is extracted therefrom as a signal of a red (R) wavelength component.

Figure 11:
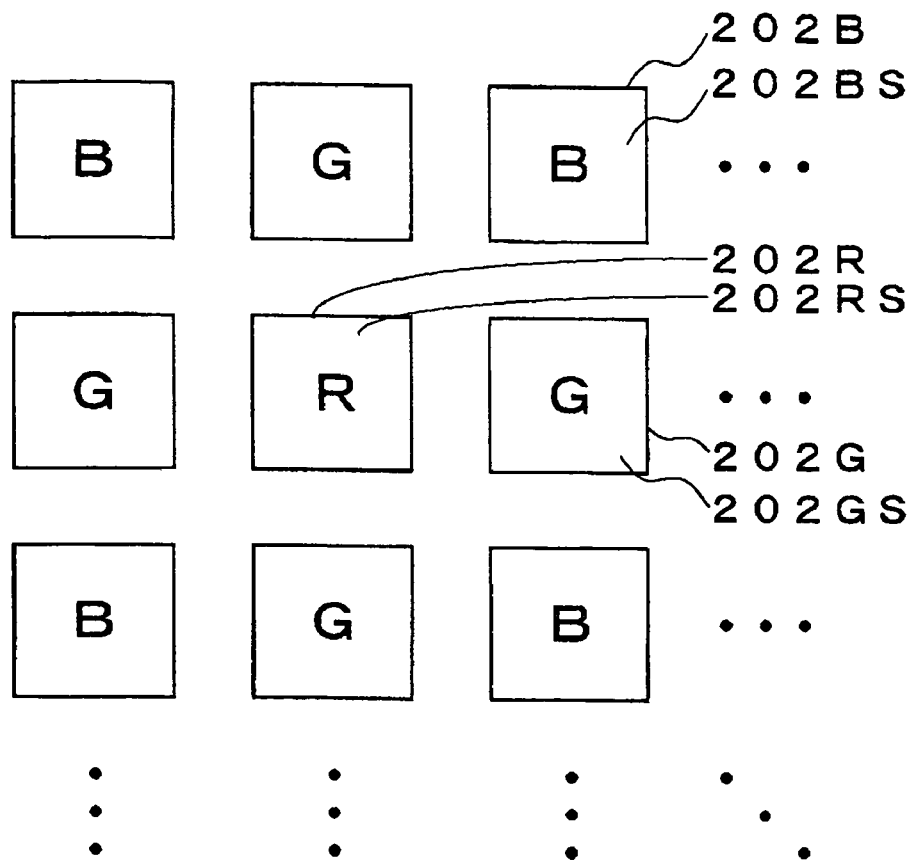
FIG. 11 is a schematic plan view showing and explaining a basic arrangement of the light receiving sections in the solid state imaging element unit according to Embodiment 1 of the present invention.

Reference is now made to FIG. 11 which is a schematic plan view showing and explaining a basic arrangement of the above-described three kinds of light receiving sections 202B, 202G, 202R in a solid state imaging element unit 600 (refer to FIG. 1) according to Embodiment 1 of the present invention. Note that FIG. 11 corresponds to a substrate surface 50S (refer to FIG. 9) as seen in plan view. As shown in FIG. 11, the light receiving sections 202B, 202G, 202R are arranged in a Bayer array.

That is, the light receiving sections 202B, 202G, 202R are arranged in a two-dimensional matrix as a whole. More specifically, such matrix can be divided broadly into lines having two kinds of light receiving sections 202B, 202G alternating in the line (row) direction (lateral direction on the paper in FIG. 11), and lines having two kinds of light receiving sections 202G, 202R alternating in the line direction. These two kinds of lines are alternately arranged in the column direction (longitudinal direction on the paper in FIG. 11). Here, the two kinds of lines are so arranged that the light receiving sections 202G form a zigzag pattern between two adjacent lines (so that when the matrix is viewed as a whole, the light receiving sections 202G form a checkered or mosaic pattern).

Note that in the case of the example of FIG. 11, the three kinds of light receiving sections 202B, 202G, 202R are assumed to have square-shaped light receiving surfaces 202BS, 202GS, 202RS which have the same area. Here, the term "light receiving surface" is used to mean a surface capable of photoelectrically convert incident light, and more specifically corresponds to an area of the PN junction 40J (of the photodiode 40) within and defined by the aperture area 510 as seen in plan view.

Charges Q generated by the photodiodes 40 of the light receiving sections 202R, 202G, 202B are serially read out by a read out circuit 310 of a transmission section 300 (refer to FIG. 1 and FIG. 2), so that the readout circuit 310 generates signals Sr, Sg, Sb (refer to FIG. 12) of wavelength components of the light receiving sections 202R, 202G, 202B based on the read out charges Q (more specifically on such charges Q as amplified by an amplifying transistor 312). A first signal group S1 composed of these signals Sr, Sg, Sb is output to a signal processing unit 400 (refer to FIG. 1).

Figure 12:
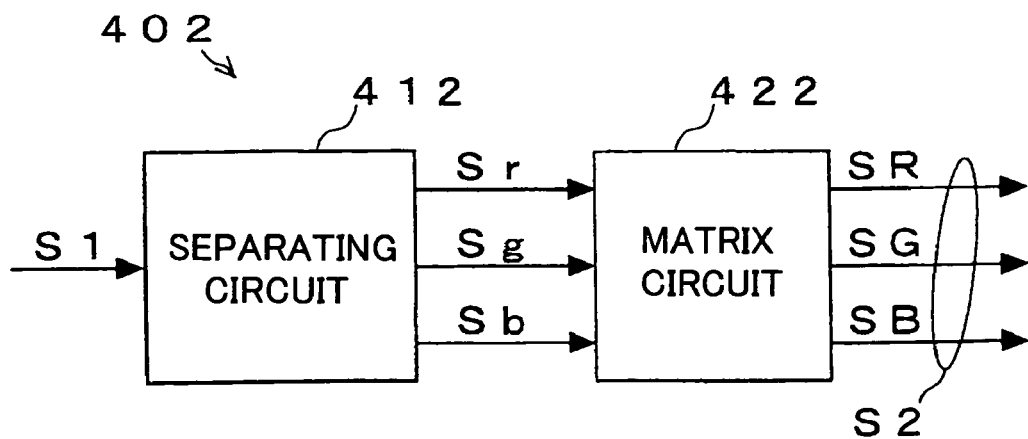
FIG. 12 is a schematic block diagram of a signal processing unit according to Embodiment 1 of the present invention.

FIG. 12 is a schematic block diagram of a signal processing unit 402 according to Embodiment 1 of the present invention which is for the solid state imaging element unit 600 having the three kinds of light receiving sections 202R, 202G, 202B, and which corresponds to the signal processing unit 400 of FIG. 1. Referring to FIG. 12, the signal processing unit 402 comprises a separating circuit 412 and a matrix circuit 422.

The separating circuit 412 separates a first signal group S1 composed of the serially output signals Sr, Sg, Sb into the respective signals Sr, Sg, Sb by using e.g. a sampling method. The matrix circuit 422 converts the signals Sr, Sg, Sb obtained by the separation to a predetermined signal group (second signal group S2) of a predetermined color system such as three primary color signals SR, SG, SB required for signal processing in a digital camera. Here, the second signal group S2 is a generic term for the three signals SR, SG, SB. For example, the signals SR, SG, SB can be obtained by conversion using equations:

$$SR=1.0 \times Sr-0.2 \times Sg-0.1 \times Sb$$

$$SG=-0.3 \times Sr+1.0 \times Sg-0.2 \times Sb$$

$$SB=-0.2 \times Sr-0.4 \times Sg+1.0 \times Sb$$

Note that although the signals Sr, Sg, Sb, as is, forming the first signal group S1 can be considered as three primary color signals, it is normally necessary to convert the signals Sr, Sg, Sb to the primary color signals SR, SG, SB by the matrix circuit 422, because the signals Sr, Sg, Sb have bandwidths wider than those of the primary color signals SR, SG, SB, which are required for signal processing in a digital camera.

As described in the foregoing, the solid state imaging element unit 600 and the solid state imaging device 100 according to the present Embodiment, which have the three kinds of light receiving sections 202B, 202G, 202R, eliminate the need for color filters. This allows the structure formed on the substrate surface 50S to be thinner by the thickness of the color filters, whereby incident light can be efficiently transmitted to arrive at the photodiode 40 in the substrate 50, thereby increasing sensitivity. Furthermore, it becomes possible to reduce the size of the cell 500 (refer to FIG. 2), thereby reducing the size of the solid state imaging element unit 600 and the solid state imaging device 100. Conversely, if the same area is used for the cells 500, the cells 500 can be more densely arranged by the size reduction of the cells 500, thereby achieving a resultant higher resolution. Such effects become more pronounced with the CMOS type which causes the structure on the substrate surface 50S to be thicker than with the CCD type. In addition, since no color filters are needed as described above, no equipment for producing color filters is needed, thereby achieving cost reduction.

According to the present Embodiment, each of the light receiving sections 202B, 202G, 202R is basically formed of a P$^+$-type layer 11 and a photodiode 40 (N-type layer 20 and P-type layer 30). Accordingly, as compared with the structure having a three-layer stack of photodiodes according to the above cited article, for example, the structure of the light receiving sections 202B, 202G, 202R is simpler. For reading outputs (charges) from light receiving sections, the structure according to the present embodiment which has a transmission section 300 including a read out circuit 310 for reading outputs from the light receiving sections 202B, 202G, 202R can be smaller in size than that according to the above cited article. Thus, it is easier to achieve size reduction by using the cells 500 than by using the three-layer stack of photodiodes. Furthermore, in contrast to the structure according to the above cited article, each of the light receiving sections 202B, 202G, 202R has a single photodiode 40, so that the spectral characteristics of the photodiode 40 can be individually set for each of the light receiving sections 202B, 202G, 202R.

In addition, since the N-type layer 20 forming the photodiode 40 has a charge output portion 22 coupled by circuit coupling to the transmission section 300, it is possible to securely read out charge Q generated by the photodiode 40, regardless of the thickness (namely first depth) d1 of the P$^+$-type layer 11 which is formed closer to the substrate surface 50S than the photodiode 40. In other words, the presence of the charge output portion 22 increases the degree of freedom in the design of the thickness d1 of the P$^+$-type layer 11, i.e. design of the spectral characteristics of the P$^+$-type layer 11. A further advantage of the charge output portion 22, in particular, which is diffused up to the substrate surface 50S in the light receiving section 202 (refer to FIG. 9), is that as compared with the case of coupling a PN junction-forming portion 21 of the N-type layer 20 to a read transistor 311 by circuit coupling, a lower gate voltage can be used for the transistor 311.

Embodiment 2

Figure 13:
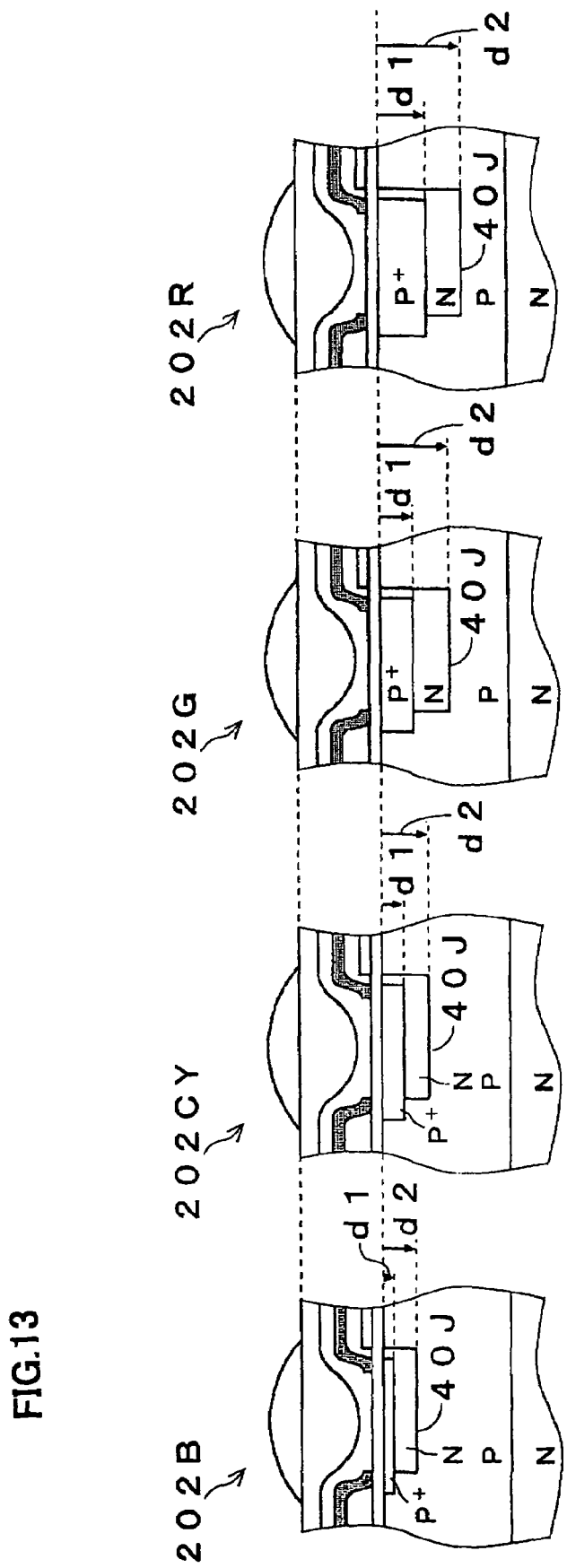
FIG. 13 is a schematic cross-sectional view of different kinds of light receiving sections according to Embodiment 2 of the present invention.

FIG. 13 is a schematic cross-sectional view of different kinds of light receiving sections 202B, 202CY, 202G, 202R according to Embodiment 2 of the present invention corresponding to the light receiving sections 200 (refer to FIG. 1 and FIG. 2), in which the four kinds of light receiving sections 202B, 202CY, 202G, 202R are assumed to be used in place of the light receiving sections 200 in a solid state imaging element unit 600 (refer to FIG. 1).

Among the four kinds of light receiving sections, the light receiving sections 202B, 202G, 202R are the same as those already described above in Embodiment 1. That is, the light receiving section 202B extracts a signal of a blue (B) wavelength component from light having a wavelength range or component of about 400 nm to 500 nm in the incident light, and the light receiving section 202G extracts a signal of a green (G) wavelength component from light having a wavelength range of about 500 nm to 600 nm in the incident light, while the light receiving section 202R extracts a signal of a red (R) wavelength component from light having a wavelength range of about 550 nm to 700 nm in the incident light. Note that in the present Embodiment 2, the depths d2 of PN junctions 40J of these three kinds of light receiving sections 202B, 202G, 202R are assumed to be about 0.3 µm, about 0.6 µm and about 1.0 µm, respectively.

On the other hand, the light receiving section 202CY has a depth d1 of about 0.2 µm, and a junction depth d2 of about 0.45 µm, with a PN junction-forming portion 21 of an N-type layer 20 (refer to FIG. 9) being of a thickness of about 0.25 µm. According to the light receiving section 202CY, charge Q generated (excited) by light having a wavelength range of about 450 nm to 550 nm in the incident light is extracted therefrom as a signal of a cyan (CY) wavelength component. Thus, a first signal group S1 output from the transmission section 300 is composed of signals Sb, Sg, Sr, Scy (refer to FIG. 15 later) of the respective blue (B), green (G), red (R) and cyan (CY) components, which are extracted from the respective light receiving sections 202B, 202G, 202R, 202CY based on charges Q generated therein.

Figure 14A:
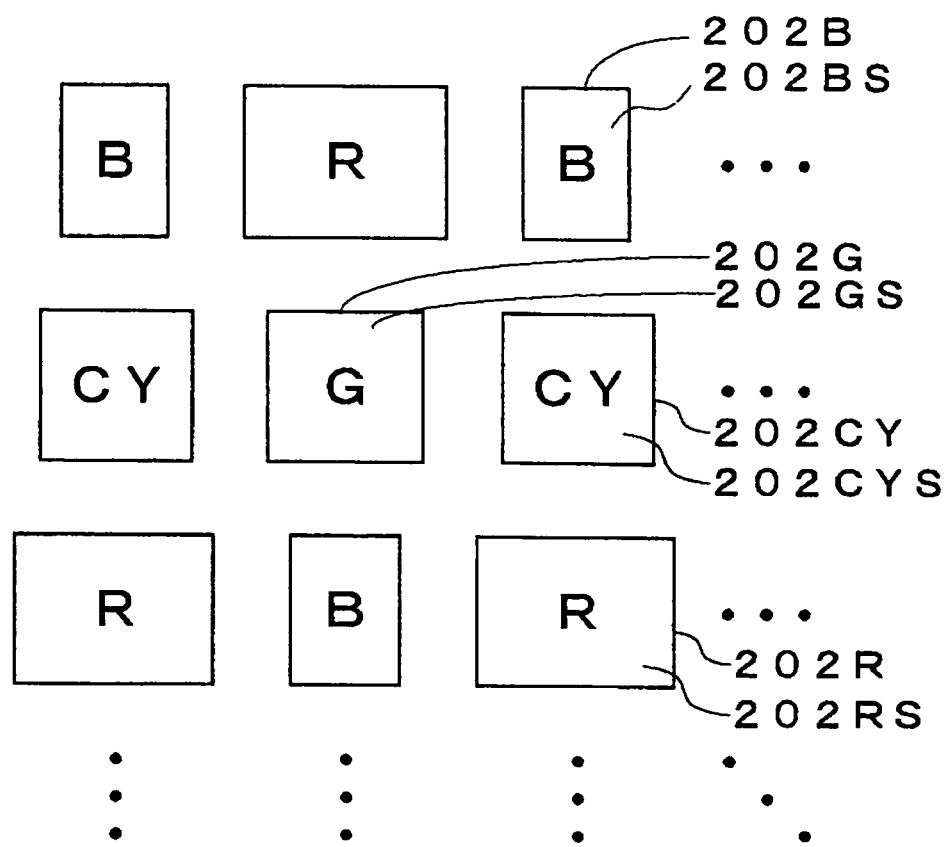

Reference is now made to FIG. 14A which is a schematic plan view showing and explaining a basic arrangement of the above-described four kinds of light receiving sections 202B, 202CY, 202G, 202R in a solid state imaging element unit 600 (refer to FIG. 1) according to Embodiment 2 of the present invention as well as areas and shapes of light receiving surfaces 202BS, 202CYS, 202GS, 202RS of the light receiving sections 202B, 202CY, 202G, 202R. Note that FIG. 14A corresponds to a substrate surface 50S (refer to FIG. 9) as seen in plan view.

In Embodiment 2, in particular, the areas, or light receiving areas, of the light receiving surfaces 202BS, 202CYS, 202GS, 202RS of the light receiving sections 202B, 202CY, 202Q 202R are set in the following manner. First, the light receiving areas of the two kinds of light receiving sections 202CY, 202G are set to be the same, while the other light receiving section 202B and light receiving section 202R are set to be smaller and larger in area, respectively, than the two kinds of light receiving sections 202CY, 202G. In a combination of three kinds of light receiving sections, either 202B, 202G, 202R or 202B, 202CY, 202R, it can be said that a light receiving section 202 having a greater PN junction depth d2 (refer to FIG. 13) is set to be larger in light receiving area, taking into consideration that the light receiving areas of the light receiving sections 202G, 202CY are the same.

In the example shown in FIG. 14A, all the light receiving surfaces 202BS, 202CYS, 202GS, 202RS are rectangular-shaped. Among them, the light receiving surfaces 202CYS, 202GS of the two light receiving sections 202CY, 202G are square-shaped. Furthermore, in this example, the variation in the light receiving area is given by varying the length of the side of the rectangle extending in the line direction (lateral direction on the paper in FIG. 14) with the length of the side of the rectangle extending in the column direction (longitudinal direction on the paper in FIG. 14) being set to be the same. However, other methods can be used to vary the light receiving area.

As already described above, the term "light receiving surface" is used to mean a surface capable of photoelectrically convert incident light, and more specifically corresponds to an area of the PN junction 40J (of the photodiode 40) within and defined by the aperture area 510 as seen in plan view (refer to FIG. 9). The area of the light receiving area can be adjusted, for example, by adjusting the area of the PN junction 40J itself along with the aperture area 510, and can also be adjusted by adjusting the size of the aperture area 510 (for example, by adjusting the shape or position of the light shielding layer 82 shown in FIG. 9) with the areas of the PN junctions 40J of the four kinds of light receiving sections 202B, 202CY, 202G, 202R being set to be the same.

As shown in FIG. 14A, the light receiving sections 202B, 202CY, 202G, 202R are arranged in a two-dimensional matrix as a whole. More specifically, such matrix can be divided broadly into lines having two kinds of light receiving sections 202B, 202R alternating in the line (row) direction (lateral direction on the paper in FIG. 14A), and lines having two kinds of light receiving sections 202CY, 202G alternating in the line direction. These two kinds of lines are alternately arranged in the column direction (longitudinal direction on the paper in FIG. 14A). Here, the two kinds of lines are so arranged that the two kinds of light receiving sections 202B, 202R are aligned in the column direction with the light receiving section 202CY being disposed therebetween, while the two kinds of light receiving sections 202R, 202B are aligned in the column direction with the light receiving section 202G being disposed therebetween.

In the example of FIG. 14A, each line in one set of two lines is composed of the light receiving section 202B with a "small" light receiving area and the light receiving section 202R with a "large" light receiving area. On the other hand, the other line in the set of two lines is composed of the light receiving sections 202CY, 202G with the same "middle" light receiving area as compared with the light receiving sections 202B, 202R. If this area adjustment is made by the above-described method of adjusting the area of the PN junction 40J itself, namely by allowing each one of the light receiving sections 202B, 202CY, 202G, 202R to have a larger area of PN junction 40J with a larger light receiving area, the light receiving sections 202B, 202CY, 202G, 202R can be formed at a density similar to that in the case of Embodiment 1 (refer to FIG. 11). This area adjusting method is advantageous over e.g. the above-described method of adjusting the light shielding layer 82 (refer to FIG. 9) with the area of each PN junction 40J being set to be the same, because the entire area which the light receiving sections 202B, 202CY, 202G, 202R according to the PN junction area adjustment method occupy in the solid state imaging element unit 600 (refer to FIG. 1 and FIG. 2) is smaller than that according to the light shielding layer adjustment method, thereby achieving cost reduction or higher resolution of the solid state imaging element unit 600 and the solid state imaging device 100.

Figure 15:
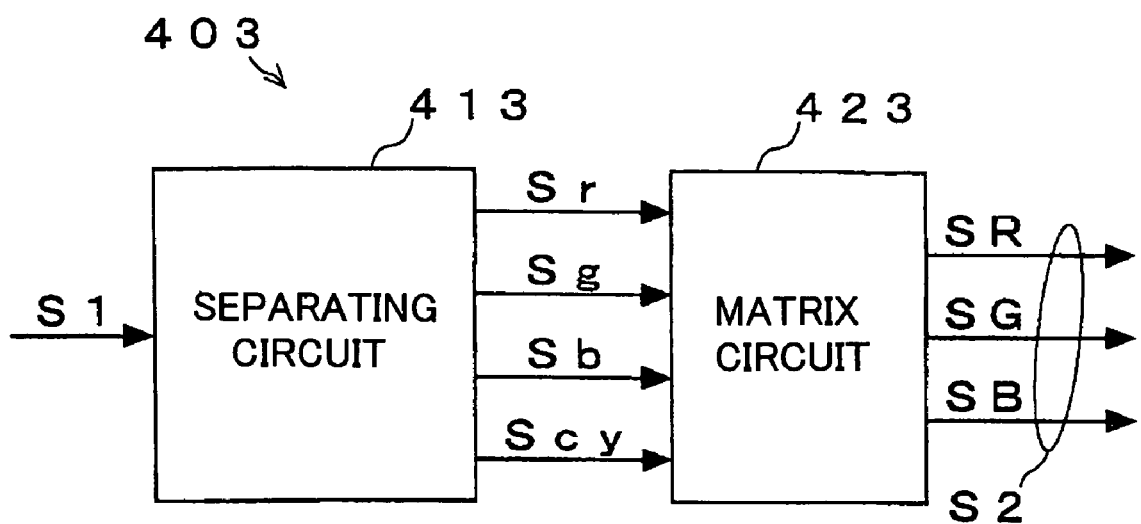
FIG. 15 is a schematic block diagram of a signal processing unit according to Embodiment 2 of the present invention.

FIG. 15 is a schematic block diagram of a signal processing unit 403 according to Embodiment 2 of the present invention which is for the solid state imaging element unit 600 (refer to FIG. 1) having the four kinds of light receiving sections 202B, 202CY, 202G, 202R and which corresponds to the signal processing unit 400 (refer to FIG. 1). Referring to FIG. 15, the signal processing unit 403 comprises a separating circuit 413 and a matrix circuit 423.

The separating circuit 413 separates a first signal group S1 composed of the serially output signals Sr, Sg, Sb, Scy into the respective signals Sr, Sg, Sb, Scy by using e.g. a sampling method. The matrix circuit 423 converts the signals Sr, Sg, Sb, Scy obtained by the separation to a predetermined signal group (second signal group S2) of a predetermined color system such as three primary color signals SR, SG, SB required for signal processing in a digital camera. Here, the second signal group S2 is a generic term for the three signals SR, SG, SB. For example, the signals SR, SG, SB can be obtained by conversion using equations:

$$SR = 1.0 \times Sr - 0.15 \times Sg - 0.1 \times Scy + 0.05 \times Sb$$

$$SG = -0.3 \times Sr + 1.0 \times Sg - 0.05 \times Scy - 0.15 \times Sb$$

$$SB = 0.1 \times Sr - 0.4 \times Sg - 0.4 \times Scy + 1.0 \times Sb$$

According to Embodiment 2, the number of (kinds of) light receiving sections 202B, 202CY, 202G, 202R is greater than the number of three primary color signals. Thus, the primary color signals SR, SG, SB, which are required for signal processing in a digital camera, can be generated using such more wavelength components of incident light, thereby improving color reproducibility.

Figure 16A:
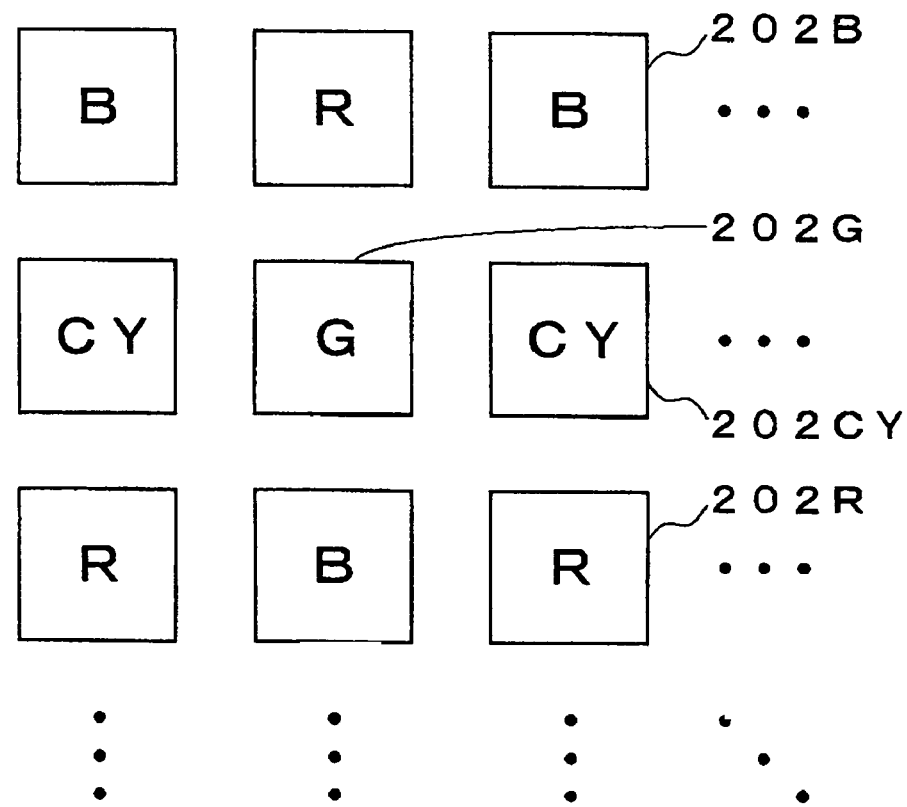
Figure 16B:
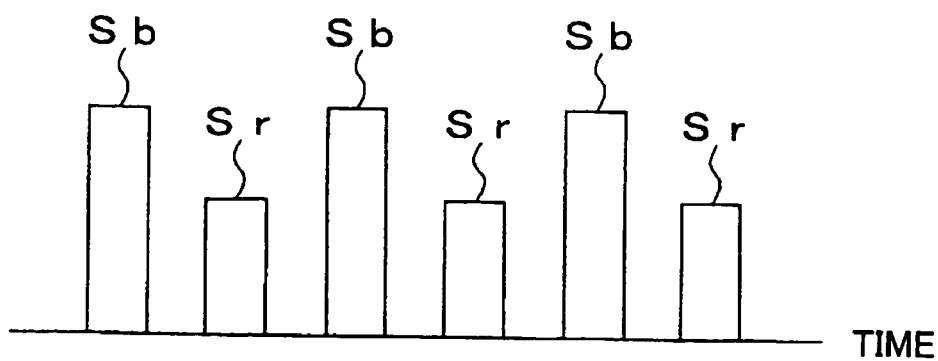
FIG. 16B is a schematic graph showing signals from two receiving sections as obtained from the light receiving areas as shown in FIG. 16A.

Reference is now made to FIG. 16A which is a schematic plan view showing and explaining a basic arrangement of light receiving sections in a solid state imaging element unit for comparison as well as areas and shapes of light receiving surfaces of such light receiving sections. Reference is also made to FIG. 16B which is a schematic graph showing signals Sb, Sr from light receiving sections 202B, 202R as would be obtained if they had the same light receiving area as shown in FIG. 16A.

As already described with reference to FIG. 4, incident light penetrating into the silicon substrate/layer from a substrate surface 50S generally becomes weaker as penetration depth (distance) of light from the substrate surface 50S increases. Accordingly, as the depth d2 increases, i.e. as the position of the PN junction 40J of the photodiode 40 is deeper, the amount of generated charge Q decreases. Thus, if all the light receiving sections 202B, 202CY, 202G, 202R had the same light receiving area as shown in FIG. 16A, it would not be possible to achieve good image quality for the following reason. As shown in FIG. 16B, there would be a large difference in signal level between the signal Sb and the signal Sr, which are signals from the light receiving sections 202B, 202R having the smallest (shallowest) PN junction depth d2 and the greatest (deepest) PN junction depth d2, respectively. The low signal level of the red (R) signal Sr relative to the signal level of the blue (B) signal Sb would cause a resultant reproduced image based on a color camera (digital camera) to be of low quality.

Figure 14B:
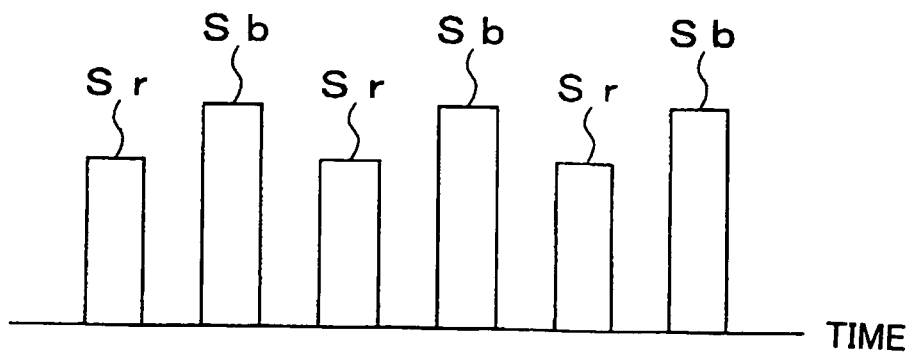
FIG. 14B is a schematic graph showing signals from two light receiving sections as obtained from the light receiving areas shown in FIG. 14A.

Thus, as shown in FIG. 14A, the light receiving sections 202B, 202CY, 202Q 202R according to the present Embodiment 2 are so devised that as the PN junction depth d2 (refer to FIG. 13) increases, the light receiving area increases so as to generate more charge Q thereby. In other words, each of the light receiving sections 202B, 202CY, 202G, 202R has a larger light receiving area with a greater depth d2. This makes it possible to correct or adjust the levels of signals Sb, Scy, Sg, Sr among the four different kinds of light receiving sections 202B, 202CY, 202Q 202R. For example, it is possible to correct or adjust the signal levels of the respective blue (B), cyan (CY), green (G) and red (R) wavelength components so that they correspond to the light amounts of the respective wavelength components at the substrate surface 50S, thereby achieving a resultant reproduced image of high quality. FIG. 14B is a schematic graph showing signals Sb, Sr from the light receiving sections 202B, 202R as obtained by the adjustment of the light receiving areas shown in FIG. 14A. It is apparent from FIG. 14B that the signal levels are improved by the adjustment of the light receiving area.

Embodiment 3

Figure 17:
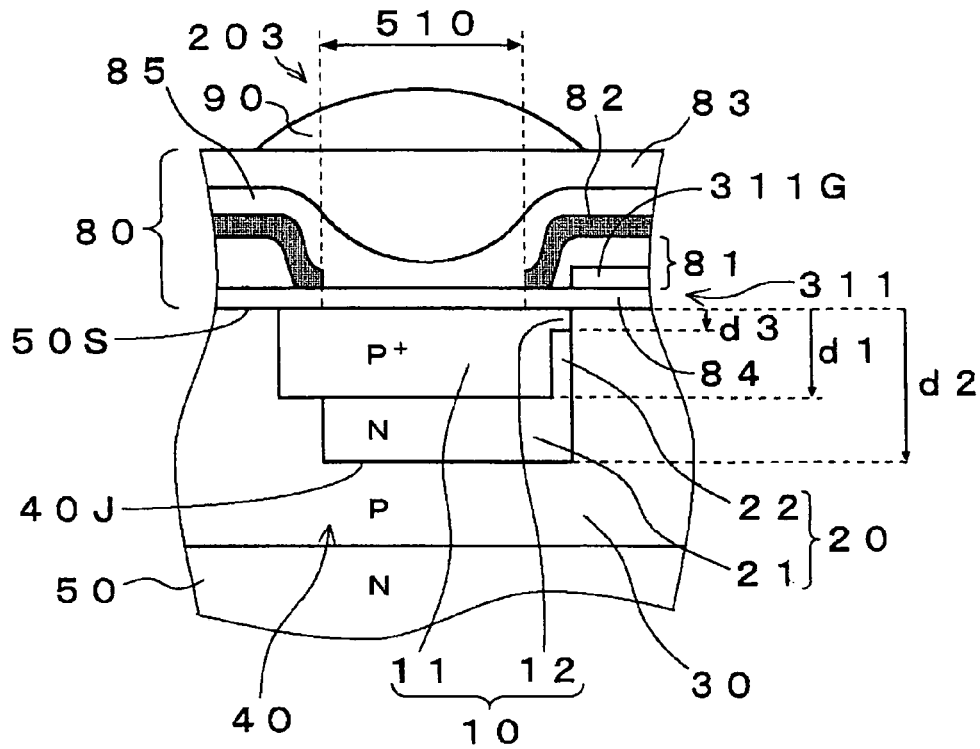
FIG. 17 is a schematic cross-sectional view of a light receiving section according to Embodiment 3 of the present invention.

FIG. 17 is a schematic cross-sectional view of a light receiving section 203 according to Embodiment 3 of the present invention which corresponds to the above-described light receiving section 202 (refer to FIG. 9). Referring to FIG. 17, the light receiving section 203 is basically the same as the light receiving section 202, except that the $P^+$-type layer 11 of the light receiving section 202 is replaced by a $P^+$-type silicon layer 10 (hereafter referred to simply as "$P^+$-type layer 10"). Note that similarly as in the $P^+$-type layer 11 (refer to FIG. 9), the $P^+$-type layer 10 has a higher impurity concentration than a P-type layer (silicon layer) 30.

More specifically, the $P^+$-type layer 10 comprises a $P^+$-type layer 11 (refer to FIG. 9) similar to the above-described $P^+$-type layer 11 as a first portion (thus the $P^+$-type layer 11 in the present Embodiment 3 being referred to as "first portion 11" using the same reference numeral "11"), and also comprises a second (supplemental) portion 12. The second portion 12 is contiguous to the first portion 11, and is diffused to a charge output portion 22 of an N-type layer 20. Further, the second portion 12 is diffused from a substrate surface 50S to a depth (third depth) d3 in the silicon substrate/layer which is smaller (shallower) than a depth d1 of the first portion 11. At the depth d3, the second portion 12 is in contact with the charge output portion 22. Note that the addition of the second portion 12 prevents the charge output portion 22 from being in contact with (from reaching) the substrate surface 50S in the light receiving section 203, in which the charge output portion 22 is diffused from a PN junction-forming portion 21 to the depth d3. Even with such structure, the charge output portion 22 can be considered to be diffused from the PN junction-forming portion 21 to or toward the substrate surface 50S.

According to the light receiving section 203 of Embodiment 2, since the $P^+$-type layer 10 has a higher impurity concentration than the P-type layer 30, problems of the substrate surface 50S above the charge output portion 22, such as crystal defects and leak current caused by the crystal defects, can be reduced by the second portion 12 of the $P^+$-type layer 10. Here, as compared with the case of coupling the PN junction-forming portion 21 of the N-type layer 20 to a read transistor 311 by circuit coupling, a lower gate voltage can be used for the transistor 311, since the thickness of the second portion 12 (i.e. third depth) d3 is smaller than the thickness of the first portion 11 (i.e. first depth) d1 in the $P^+$-type layer 10, so that a portion (charge output portion 22) of the N-type layer 20 is relatively close to a gate electrode 311G of the read transistor 311.

It is to be noted that the light receiving section 203 can be varied in spectral characteristics by varying the thickness (i.e. first depth) d1 of the first portion 11 of the P$^+$-type layer 10 as well as the PN junction depth d2, whereby various kinds of light receiving sections 203 with various spectral characteristics can be made. Accordingly, the light receiving section 203 can be used as a light receiving section 200 of a solid state imaging device 100 (refer to FIG. 1) instead of the light receiving section 202 (refer to FIG. 9) described above.

Figure 18:
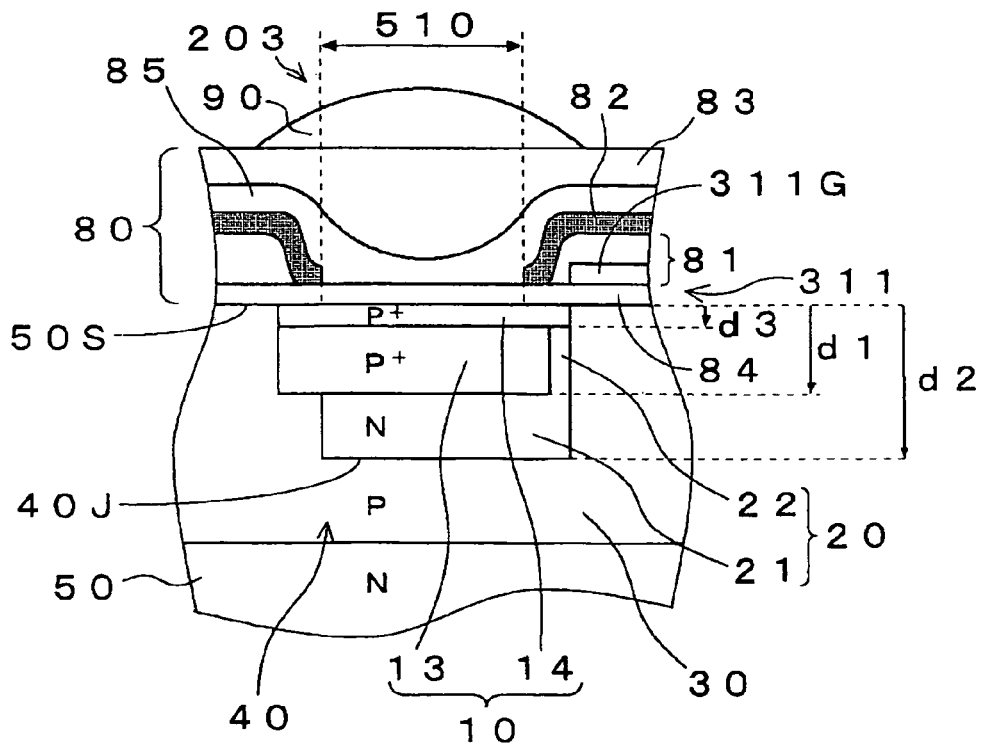
FIG. 18 is a schematic cross-sectional view of a light receiving section corresponding to the light receiving section of FIG. 17 for describing an aspect of a manufacturing process.

Reference is now made to FIG. 18, which is a schematic cross-sectional view of a light receiving section 203 corresponding to the above-described light receiving section 203 (refer to FIG. 17), to describe an aspect of the manufacturing process. Referring to FIG. 18, the P$^+$-type layer 10 of the light receiving section 203 can be divided broadly into two portions 13, 14, more specifically a portion (hereafter referred to as "third portion") 13 between the depths d3, d1, and a portion (hereafter referred to as "fourth portion") 14 from the substrate surface 50S to the depth d3. Note that as seen by comparing the third and fourth portions 13, 14 with the first and second portions 11, 12 (refer to FIG. 17) described above, the third portion 13 is a part of the first portion 11 from the depth d3 to the depth d1, while the fourth portion 14 is a part of the first portion 11 from the substrate surface 50S to the depth d3 including the second portion 12.

It is possible to set impurity concentrations of the third and fourth portions 13, 14 to be different from each other by individually controlling the impurity concentrations of the third and fourth portions 13, 14. For example, the impurity concentration of the fourth portion 14 can be set higher than that of the third portion 13. Here, taking into consideration that the P$^+$-type layer 10 has a higher impurity concentration than the P-type layer 30, the impurity concentration of the fourth portion 14 is considered to be particularly high. This makes it possible to enhance the effect of reducing the problems of the substrate surface 50S in the P$^+$-type layer 10 such as crystal defects and leak current caused by the crystal defects. Further, by controlling the thickness of the third portion 13 (difference between the depths d1, d3), the spectral characteristics based on the thickness of the P$^+$-type layer 10 can be controlled.

Note that from the point of view of reading out charge to the read transistor 311, the fourth portion 14 is desired to be thin (shallow). It is preferable that the fourth portion 14 be thinner with a higher impurity concentration. Depending on the amount and depths of the crystal defects on the substrate surface 50S, good results can be obtained. For example, by selecting the depth d3 (i.e. thickness) to be about 0.2 μm or smaller in the case where the impurity concentration is about $10^{18}/cm^3$, it is possible to achieve both good charge readout and the above-described effect of reducing e.g. the crystal defects by the fourth portion 14.

Thus, the formation of the P$^+$-type layer 10 by two separate portions (third portion 13 and fourth portion 14) makes it possible that the third portion 13 is set to have an optimum impurity concentration for the purpose of reducing the crystal defects, and is as thin as possible, and that the fourth portion 14 is freely formed with a thickness for the purpose of enabling predetermined spectral characteristics. In other words, the respective portions 13, 14 can be made to have an optimum impurity and an optimum thickness for the respective purposes. Accordingly, it is possible to substantially equalize, and at the same time increase, the dynamic ranges of the photodiodes.

It is to be noted that the present invention is not limited to the above embodiments, and various modifications are possible. For example, in Embodiments 1 to 3, the light receiving surfaces (e.g. 202BS as shown in FIG. 11) are shown as being rectangular-shaped, but can also be hexagonal-shaped. Further, in Embodiments 1 to 3, the light receiving sections (e.g. 202) are shown as being arranged in a two-dimensional matrix (refer to e.g. FIG. 11), but can be in a so-called delta arrangement. Furthermore, the number of (kinds of) light receiving sections 202, 203 and the number of colors in the predetermined color system are not limited to those in Embodiments 1 to 3. In addition, the light receiving sections 202, 203 can be applied to a CMOS type solid state imaging element having an internal MOS transistor in common for a plurality of cells.

The present invention has been described above using presently preferred embodiments, but such description should not be interpreted as limiting the present invention. Various modifications will become obvious, evident or apparent to those ordinarily skilled in the art, who have read the description. Accordingly, the appended claims should be interpreted to cover all modifications and alterations which fall within the spirit and scope of the present invention.

This application is based on Japanese patent application 2005-161058 filed Jun. 1, 2005, the content of which is hereby incorporated by reference.

What is claimed is:

1. A solid state imaging device comprising:
a plurality of kinds of light receiving sections for photoelectrically converting incident light to generate charge;
a transmission section for reading out the charge, and for outputting, based on the charge, a first signal group from the plurality of kinds of light receiving sections; and
a signal processing unit for generating a second signal group of a predetermined color system from the first signal group,
wherein each of the plurality of kinds of light receiving sections comprises:
a first semiconductor layer of a first conduction type having a first portion diffused from a substrate surface to a first depth in a semiconductor substrate;
a second semiconductor layer of a second conduction type having a PN junction-forming portion which is in contact with the first portion of the first semiconductor layer at the first depth, and which is diffused from the first depth to a second depth greater than the first depth, and further which forms a PN junction of a photodiode at the second depth in the semiconductor substrate; and
a third semiconductor layer of the first conduction type for forming the PN junction at the second depth with the PN junction-forming portion of the second semiconductor layer,
wherein the first semiconductor layer has a higher impurity concentration than that the third semiconductor layer, and
wherein the plurality of kinds of light receiving sections are different in the first depth and the second depth in the semiconductor substrate.

2. The solid state imaging device according to claim 1, wherein the transmission section includes a MOS transistor formed in each of the light receiving sections for reading out the charge, and
wherein the second semiconductor layer further has a charge output portion diffused from the PN junction to the substrate surface and coupled by circuit coupling to the MOS transistor for outputting the charge to the transmission section.

3. The solid state imaging device according to claim 1,
wherein the transmission section includes a MOS transistor formed in each of the light receiving sections for reading out the charge,
wherein the second semiconductor layer further has a charge output portion which is diffused from the PN junction to a third depth smaller than the first depth in the semiconductor substrate, and which is coupled by circuit coupling to the MOS transistor for outputting the charge to the transmission section, and
wherein the first semiconductor layer further has a second portion which is diffused from the substrate surface to the third depth, and which is in contact with the charge output portion of the second semiconductor layer at the third depth.

4. The solid state imaging device according to claim 3,
wherein the first semiconductor layer is formed of:
a third portion which is a portion of the first portion from the third depth to the first depth; and
a fourth portion which is formed of the second portion and a portion of the first portion from the substrate surface to the third depth,
wherein the impurity concentrations of the third portion and the fourth portion are set to be different from each other.

5. The solid state imaging device according to claim 4, wherein the number of the plurality of kinds of light receiving sections is greater than the number of colors of the predetermined color system.

6. The solid state imaging device according to claim 1, wherein the number of the plurality of kinds of light receiving sections is greater than the number of colors of the predetermined color system.

7. The solid state imaging device according to claim 6, wherein the greater the second depth of each of the plurality of kinds of light receiving sections is, the larger a light receiving area of each of the plurality of kinds of light receiving sections is.

8. The solid state imaging device according to claim 7, wherein the larger a light receiving area of each of the plurality of kinds of light receiving sections is, the larger an area of the PN junction of the photodiode in each of the plurality of kinds of light receiving sections is.

9. The solid state imaging device according to claim 1, wherein the greater the second depth of each of the plurality of kinds of light receiving sections is, the larger a light receiving area of each of the plurality of kinds of light receiving section is.

10. The solid state imaging device according to claim 9, wherein the larger a light receiving area of each of the plurality of kinds of light receiving sections is, the larger an area of the PN junction of the photodiode in each of the plurality of kinds of light receiving sections is.

11. A solid state imaging device comprising: a plurality of kinds of light receiving sections for photoelectrically converting incident light to generate charge;
a transmission section including a MOS transistor for reading out the charge and an amplifier for amplifying the read out charge, which are provided in each of the light receiving sections, so as to output the amplified charge as a first signal group from the plurality of kinds of light receiving sections; and
a signal processing unit for generating a second signal group of a predetermined color system from the first signal group,
wherein each of the plurality of kinds of light receiving sections comprises:
a first semiconductor layer of a first conduction type having a first portion diffused from a substrate surface to a first depth in a semiconductor substrate;
a second semiconductor layer of a second conduction type having (i) a PN junction-forming portion which is in contact with the first portion of the first semiconductor layer at the first depth, and which is diffused from the first depth to a second depth greater than the first depth, and further which forms a PN junction of a photodiode at the second depth in the semiconductor substrate, and (ii) a charge output portion diffused from the PN junction to the substrate surface and coupled by circuit coupling to the MOS transistor for outputting the charge to the transmission section; and
a third semiconductor layer of the first conduction type for forming the PN junction at the second depth with the PN junction-forming portion of the second semiconductor layer,
wherein the first semiconductor layer has a higher impurity concentration that the third semiconductor layer, and
wherein the plurality of kinds of light receiving sections are different in the first depth and the second depth in the semiconductor substrate.

12. A solid state imaging element comprising a plurality of kinds of light receiving sections for photoelectrically converting incident light to generate charge, each of the light receiving sections comprising:
a first semiconductor layer of a first conduction type having a first portion diffused from a substrate surface to a first depth in a semiconductor substrate;
a second semiconductor layer of a second conduction type having a PN junction-forming portion which is in contact with the first portion of the first semiconductor layer at the first depth, and which is diffused from the first depth to a second depth greater than the first depth, and further which forms a PN junction of a photodiode at the second depth in the semiconductor substrate; and
a third semiconductor layer of the first conduction type for forming the PN junction at the second depth with the PN junction-forming portion of the second semiconductor layer,
wherein the first semiconductor layer has a higher impurity concentration that the third semiconductor layer, and
wherein the plurality of kinds of light receiving sections are different in the first depth and the second depth in the semiconductor substrate.

* * * * *